(12) United States Patent  
Cook et al.

(10) Patent No.: US 6,520,726 B1  
(45) Date of Patent: Feb. 18, 2003

(54) APPARATUS AND METHOD FOR USING A ROBOT TO REMOVE A SUBSTRATE CARRIER DOOR

(75) Inventors: Gregory Cook, Palo Alto, CA (US); Craig Chidlow, Saratoga, CA (US); Rodney Ow, Cupertino, CA (US); Lang Van Nugyen, Mountain View, CA (US); J. Rafael Gomez, Mountain View, CA (US); Steve Reyling, Sunnyvale, CA (US); Martin P. Aalund, Mountain View, CA (US); Steven J. Remis, Sunnyvale, CA (US)

(73) Assignee: PRI Automation, Inc., Billerica, MA (US)

( * ) Notice: Subject to any disclaimer, the term of this patent is extended or adjusted under 35 U.S.C. 154(b) by 0 days.

(21) Appl. No.: 09/517,377

(22) Filed: Mar. 2, 2000

Related U.S. Application Data

(60) Provisional application No. 60/122,673, filed on Mar. 3, 1999, and provisional application No. 60/142,000, filed on Jul. 1, 1999.

(51) Int. Cl.[7] ............................................... B65G 49/07
(52) U.S. Cl. .................... 414/217; 414/416.1; 414/937; 414/939
(58) Field of Search ............................. 414/217, 416.1, 414/937, 939, 411

(56) References Cited

U.S. PATENT DOCUMENTS

| | | | |
|---|---|---|---|
| 4,842,680 A | 6/1989 | Davis et al. | 156/643 |
| 5,451,131 A | 9/1995 | Hecht et al. | 414/217 |
| 5,607,276 A | 3/1997 | Muka et al. | 414/331 |
| 5,609,459 A | 3/1997 | Muka | 414/217 |
| 5,613,821 A | 3/1997 | Muka et al. | 414/217 |
| 5,615,988 A | 4/1997 | Wiesler et al. | 414/416 |
| 5,664,925 A | 9/1997 | Muka et al. | 414/217 |
| 5,711,427 A | 1/1998 | Nyseth | 206/710 |
| 6,142,722 A | * 11/2000 | Genov et al. | 414/217 |

\* cited by examiner

Primary Examiner—Steven A. Bratlie  
(74) Attorney, Agent, or Firm—Weingarten, Schurgin, Gagnebin & Lebovici LLP

(57) ABSTRACT

A substrate handling system with integrated door removal assembly for an environmentally controlled substrate processing chamber is provided. The system includes a robot positioned within the chamber. A drive mechanism is connected to the robot. A door interface mechanism is attached to the drive mechanism and includes a door key and a door key control assembly. The drive mechanism provides mechanical control of the door key control assembly such that that door key is manipulated to couple a substrate carrier door to a port door. The coupled doors are storable within the chamber or on the robot. The drive mechanism may also include a substrate end effector, thereby allowing the robot to transport substrates within the chamber. The robot is movable within the chamber to multiple processing stations.

44 Claims, 23 Drawing Sheets

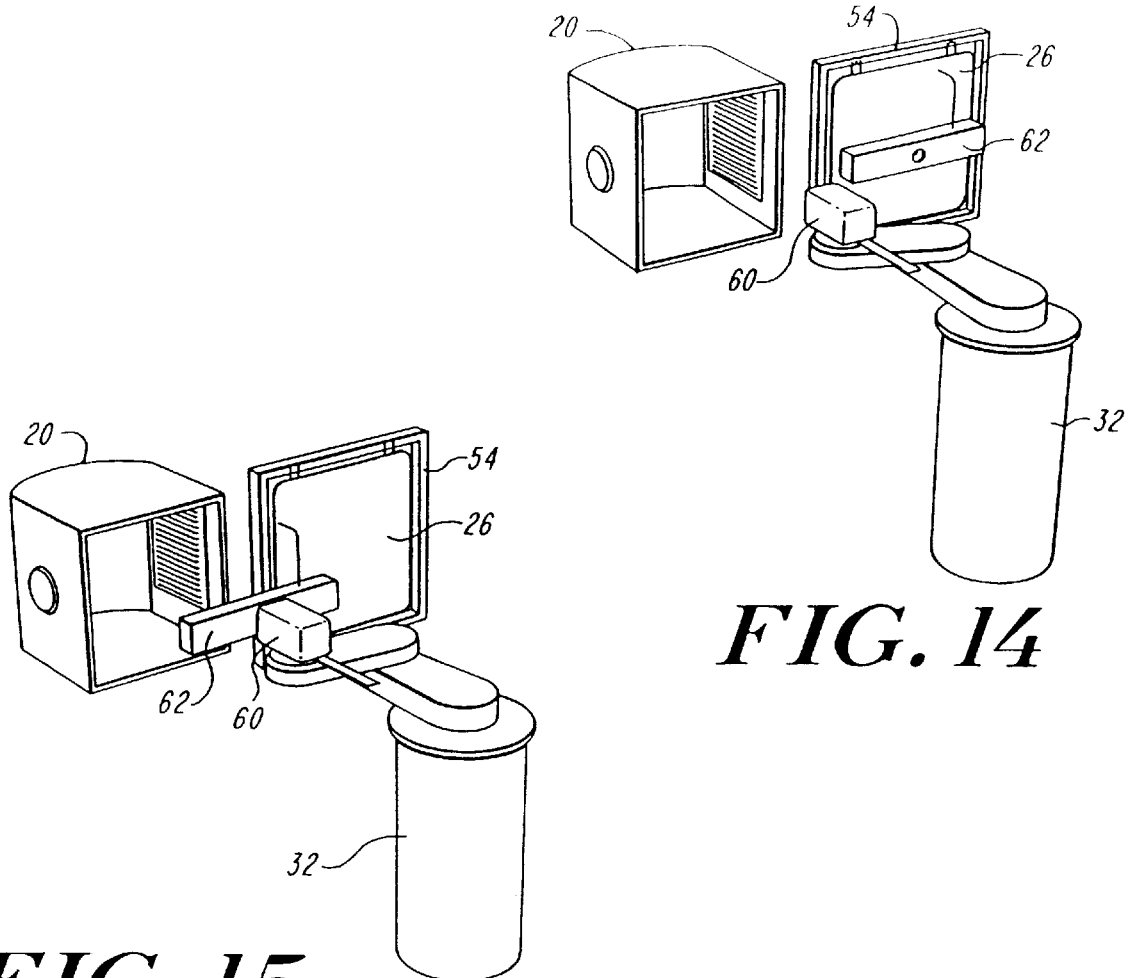
FIG. 14
FIG. 15
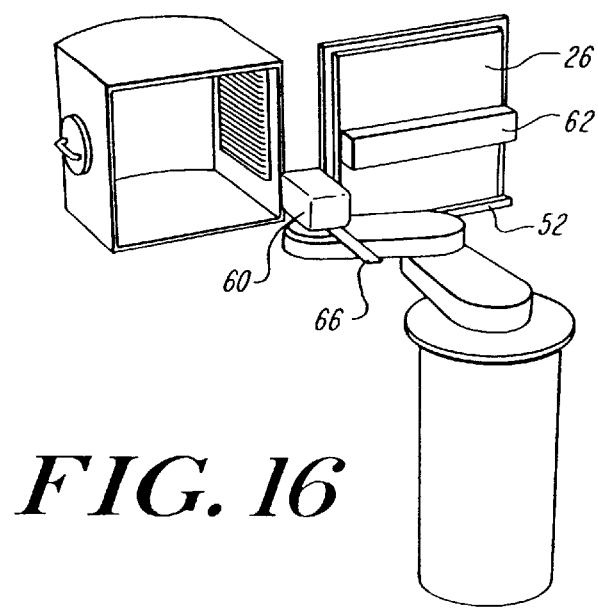
FIG. 16

APPARATUS AND METHOD FOR USING A ROBOT TO REMOVE A SUBSTRATE CARRIER DOOR

CROSS REFERENCE TO RELATED APPLICATIONS

Priority is claimed under 35 U.S.C. §119(e) to U.S. Provisional Application Nos. 60/122,673, filed Mar. 3, 1999, and Ser. No. 60/142,000, filed Jul. 1, 1999, the disclosures of both of which are incorporated by reference herein.

STATEMENT REGARDING FEDERALLY SPONSORED RESEARCH OR DEVELOPMENT

N/A

BACKGROUND OF THE INVENTION

There is a need in the electronics industry to carefully handle substrates in a mechanized manner. The term substrate includes such devices as semiconductor wafers, liquid crystal displays, flat panel displays, disk drives, and the like. Substrates are typically stored and transported in a substrate carrier. As its name implies, the term substrate carrier refers to a device that holds a set of substrates. The electronics industry utilizes a variety of substrate carriers, which are referenced by different names. For example, a substrate carrier includes a cassette, which is an open structure that holds one or more substrates. A substrate carrier also includes a box, which is a protective portable container for a cassette and/or substrates. A substrate carrier also includes a "pod", which is a box having a standard mechanical interface defined by an industry standard. The electronics industry also utilizes substrate carriers in the form of "FOUPs" (Front Opening Unified Pods), which are boxes or pods used to transport and store 300 mm semiconductor wafers.

FIG. 1 illustrates a prior art substrate processing system 10. A substrate carrier 20 is positioned on a load port 22 via a kinematic coupling 24. A substrate carrier door 26 positioned on the substrate carrier 20 provides access to a substrate transport chamber or module 30, which typically is environmentally controlled. The chamber 30 is sealed by a port door 31. The carrier door 26 couples to the port door 31, so that any particles on the external surface of either door are trapped between the door. A robot 32 is positioned within the substrate transport module 30. The robot 32 is used to remove and insert substrates 33 into the substrate carrier 20 after the substrate carrier door 26 has been removed. The robot 32 moves the substrates 33 to different substrate stations 34 where they are processed in accordance with known techniques.

The Semiconductor Equipment Manufacturing Industry (SEMI) has adopted a number of standards that define acceptable configurations for semiconductor processing equipment. These SEMI standards define configurations for the kinematic coupling 24, substrate carrier door 26, pods, FOUPS, and other substrate carriers, and the latching mechanism between the carrier door 26 and the port door 31.

A door handler 36 is used in the prior art to remove a substrate carrier door 26 and port door 31 latched together. The door handler 36 is controlled by door handler control electronics 38. The door handler 36 and door handler control electronics 38 constitute dedicated devices that serve the purpose of removing the substrate carrier door 26 coupled to the port door 31. They also act as the interface between the factory automation system and the tool, and communicate status to the tool and/or fab host. These devices add considerable expense and complexity to a substrate processing system 10. This expense and complexity is compounded in the case where the substrate transport module 30 has multiple load ports 22, each of which requires a separate door handler 36 and associated door handler electronics 38.

Accordingly, it would be highly desirable to provide a substrate transport system 10 that does not require multiple door handles 36 and associated door handler electronics 38. Ideally, such a system would remain largely compliant with relevant SEMI standards.

BRIEF SUMMARY OF THE INVENTION

The apparatus of the invention includes a substrate transport system that may be employed with a substrate transport chamber or module, which typically is environmentally controlled. A robot is positioned within the substrate transport chamber or transport module. A drive mechanism is connected to the robot. A door interface mechanism is attached to the drive mechanism and includes a door key control assembly operative to manipulate one or, more typically, two door keys. The drive mechanism provides mechanical control of the door key control assembly such that the door key or keys are manipulated to couple a substrate carrier door to a port door and release the substrate carrier door from the substrate. The drive mechanism is further operative to place the coupled doors in a storage location within the chamber or module. The drive mechanism may also include a substrate handling paddle, thereby allowing the robot to transport substrates within the substrate chamber or module.

The method of the invention includes the step of removing a substrate carrier door coupled to the port door from a substrate carrier with a substrate carrier door removal device positioned on a robot. The robot is then operated to store the coupled substrate carrier door and port door. Alternatively, the robot can carry the coupled doors with it. Subsequently, the robot is manipulated to transport a substrate positioned within the substrate carrier to a substrate processing or transport station or another loading station.

The system of the invention eliminates the need for dedicated door handlers and associated door handler electronics. Advantageously, the system can be constructed in accordance with relevant SEMI standards.

BRIEF DESCRIPTION OF THE SEVERAL VIEWS OF THE DRAWING

For a better understanding of the invention, reference should be made to the following detailed description taken in conjunction with the accompanying drawings, in which:

FIG. 14 illustrates the robotically mounted substrate carrier door removal device of the invention after the door interface mechanism has been stored with the substrate carrier door in a frame;

FIG. 15 illustrates the robotically mounted substrate carrier door removal device of the invention after it has stored a substrate carrier door in a frame;

FIG. 16 illustrates the robotically mounted substrate carrier door removal device of the invention after it has stored a substrate carrier door on a ledge;

Like reference numerals refer to corresponding parts throughout the drawings.

DETAILED DESCRIPTION OF THE INVENTION

Figure 1:
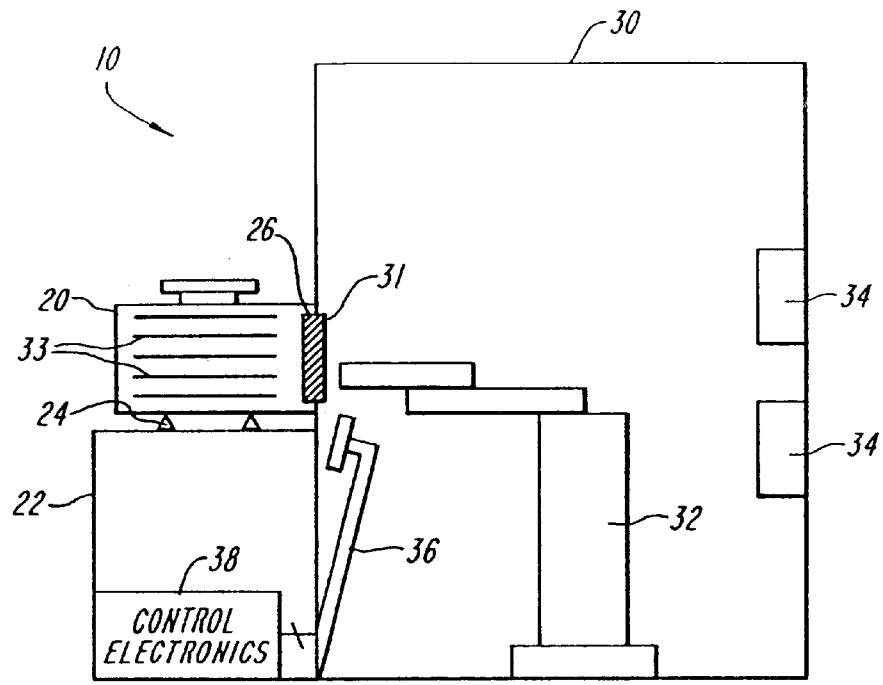
FIG. 1 illustrates a substrate transport system with a dedicated door handler 36 in accordance with the prior art.
Figure 2:
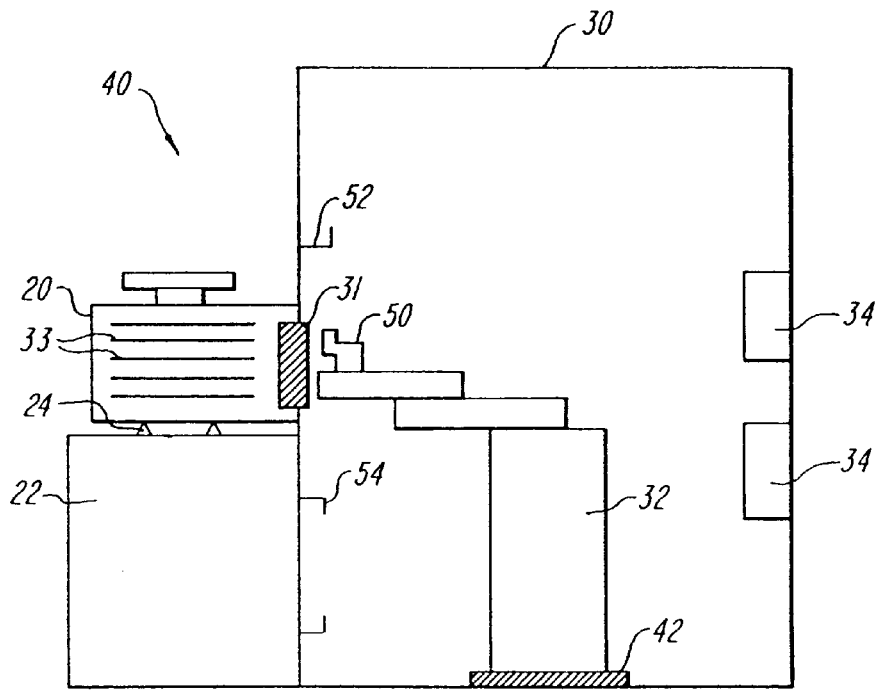
FIG. 2 illustrates a substrate transport system with a robotically mounted substrate carrier door removal device in accordance with an embodiment of the invention.

FIG. 2 illustrates a substrate transport system 40 in accordance with an embodiment of the invention. The system 40 generally corresponds to the system 10 of FIG. 1. It does not, however, include a dedicated door handler 36 and associated control electronics 38. Instead, the system 40 utilizes a robotically mounted substrate carrier door removal device 50. Thus, the system 40 avoids the expense of a dedicated door handler 36 and associated control electronics 38, while exploiting the robot 32, which is already resident in the substrate transport chamber 30. Preferably, the robotically mounted substrate carrier door removal device 50 is configured to be compliant with relevant SEMI standards. For example, the robotically mounted substrate carrier door removal device 50 is preferably configured for compliance with SEMI standards for substrate carrier doors.

Preferably, the robot 32 is mounted on a robot transport mechanism 42. For example, the robot transport mechanism 42 may be used to axially move the robot 32 so that it is positioned in front of additional substrate carriers, discussed further below.

FIG. 2 also illustrates different mechanisms for storing a removed substrate carrier door coupled to a port door. In particular, the figure illustrates a ledge 52 and a frame 54, which may be used to store a removed substrate carrier door coupled to a port door, as further discussed below.

Those skilled in the art will recognize a number of advantages associated with the invention. First, the invention eliminates the expense and complexity of a dedicated door handler 36 and door handler control electronics 38. The invention utilizes an "add-on" (the robotically mounted substrate carrier door removal device 50) to the already existent robot 32. Standard robotic programming instructions may be used to operate the substrate carrier door removal device 50. Only minor modifications, in the form of a ledge 52, frame 54, or similar device, are required to the substrate transport chamber 30. Observe also that in the case of a substrate transport chamber 30 that has multiple loading ports, a single robot 32 on a robot transport mechanism 42 may be used instead of separate door handlers at each loading port, resulting in a substantial cost reduction for the overall substrate processing system 40.

The general nature of the invention and its benefits have now been described. Attention presently turns to a more detailed description of different embodiments of the invention.

Figure 3:
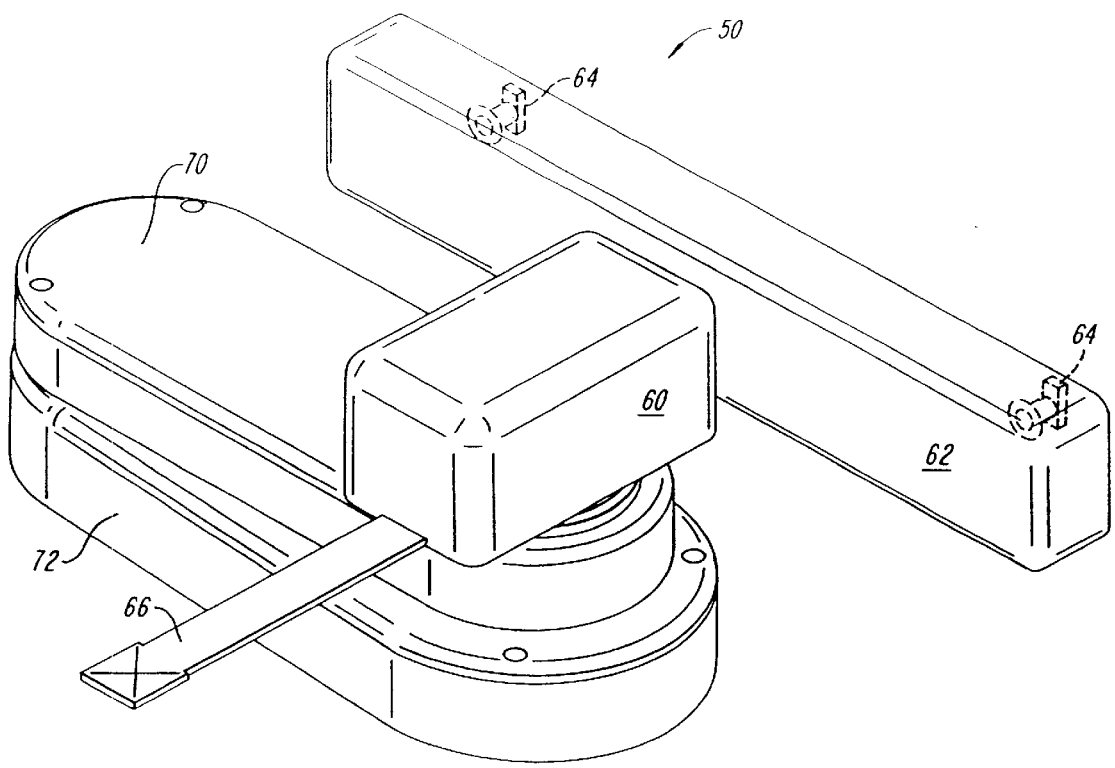
FIG. 3 is a perspective view of a robotically mounted substrate carrier door removal device in accordance with an embodiment of the invention.

FIG. 3 is a perspective view of a robotically mounted substrate carrier door removal device 50 in accordance with an embodiment of the invention. The device 50 includes a drive mechanism 60 connected to a door interface mechanism 62. The door interface mechanism 62 includes a set of door keys 64 for opening a substrate carrier door. Preferably, the door keys 64 are positioned in accordance with SEMI standards. On the opposite side of the drive mechanism 60 is a substrate end effector 66 for transporting substrates, as discussed below. The end effector may be a paddle, as shown, or a horse-shoe, gripper, or other mechanism (not shown) as known in the art. The drive mechanism 60 is positioned on a robot. FIG. 3 illustrates an upper arm link 70 and a lower arm link 72 of a robot.

Figure 4:
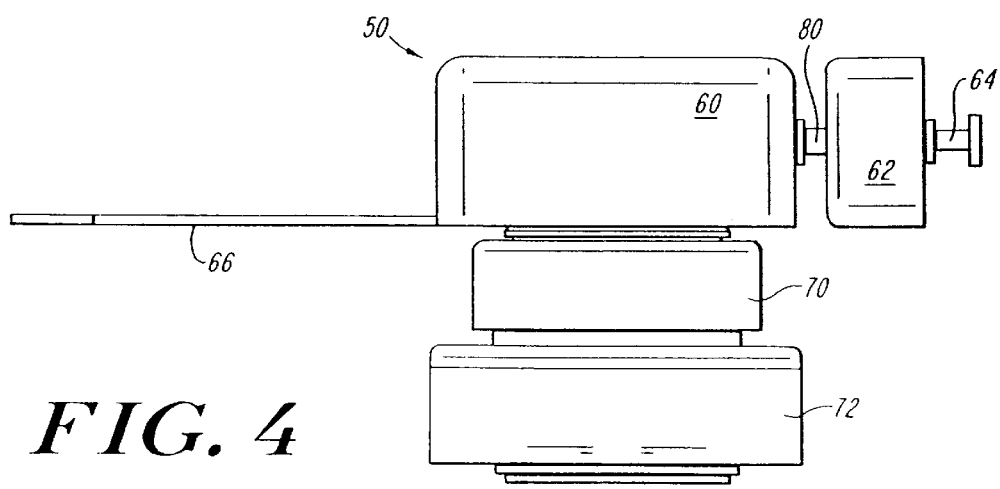
FIG. 4 is a side view of the robotically mounted substrate carrier door removal device of FIG. 3.

FIG. 4 is a side view of the apparatus of FIG. 3. The figure illustrates the drive mechanism 60 and the door interface mechanism 62. A drive shaft 80 associated with the drive mechanism 60 extends into the door interface mechanism to activate a door key control assembly, which is discussed below. FIG. 4 also illustrates the substrate paddle 66, the upper arm link 70, and the lower arm link 72.

Figure 5:
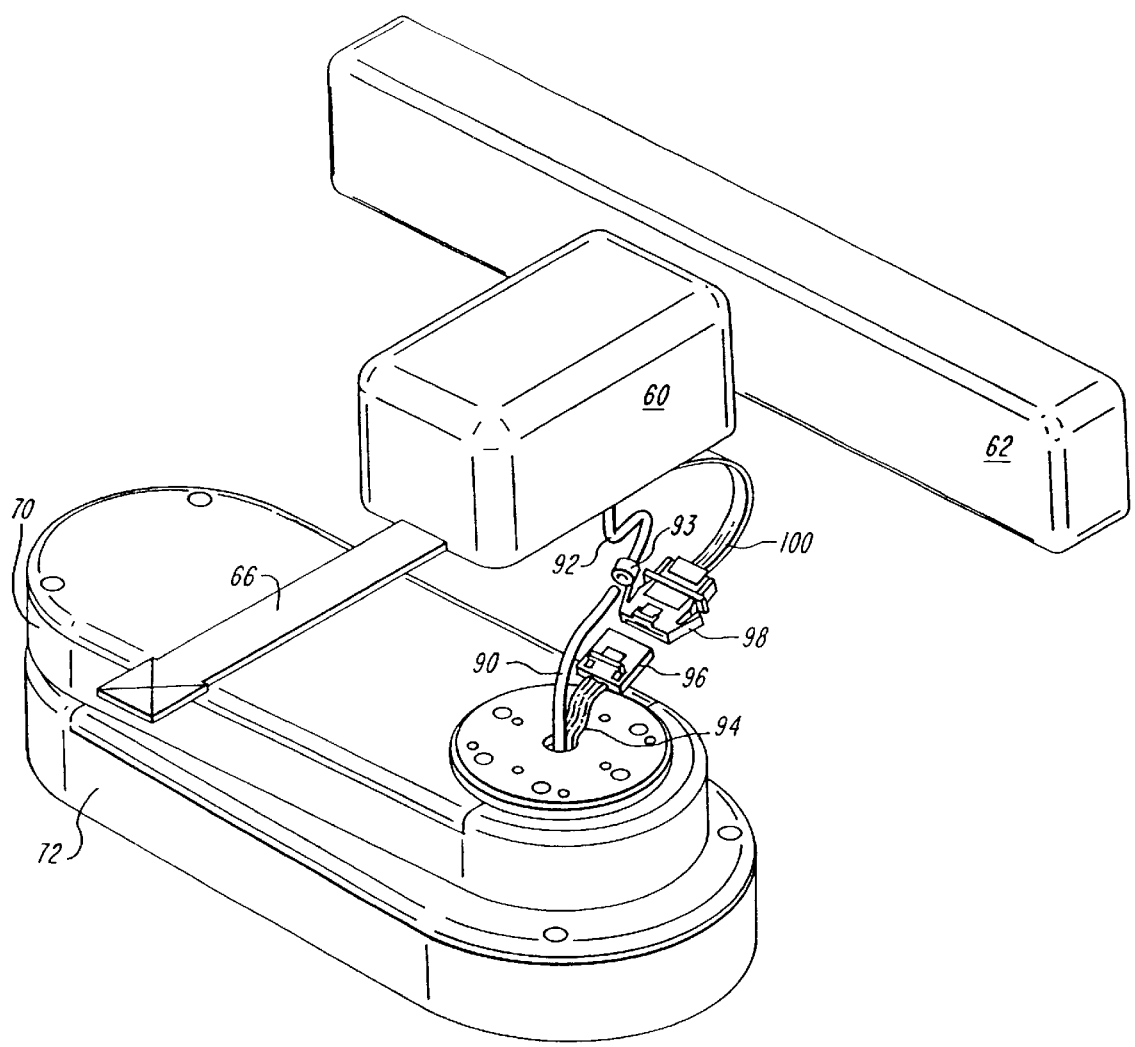
FIG. 5 is a perspective view of the interface between a robotically mounted substrate carrier and a robot in accordance with an embodiment of the invention.

FIG. 5 is a perspective view of the interface between the robotically mounted substrate carrier door removal device 50 and upper arm link 70 of the robot 32. The upper arm link 70 includes a robot vacuum line 90, which is connected to a drive mechanism vacuum line 92 associated with the drive mechanism 60. The drive mechanism vacuum line 92 includes a sleeve 93 for coupling with the robot vacuum line 90. The vacuum source is used by the substrate paddle 66 to hold a substrate positioned on it. The vacuum source may also be used in connection with the door interface mechanism 62 to stabilize a substrate carrier door as it is being transported. Vacuum or compressed air may also be used to actuate an edge gripping or other handling mechanism.

FIG. 5 also illustrates a robot electronics cable 94 and a robot electronics connector 96, which is used for coupling to a drive mechanism connector 98. A drive mechanism cable 100 is attached to the drive mechanism connector 98. The drive mechanism cable 100 carries the power and control signals for the drive mechanism 60, door interface mechanism 62, and the paddle 66.

Figure 6:
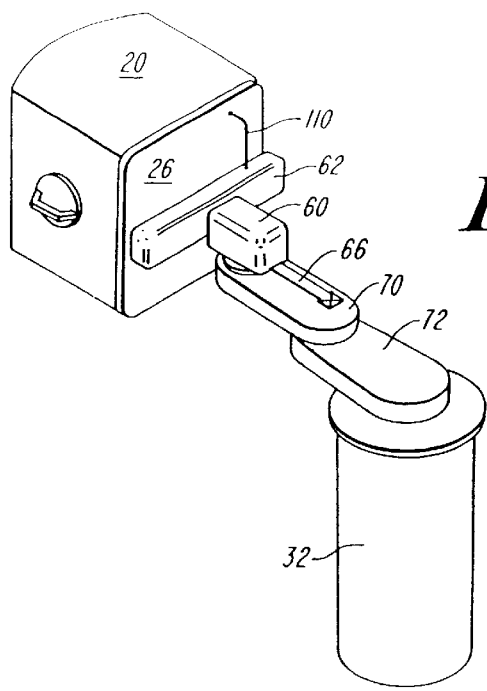
FIG. 6 illustrate the robotically mounted substrate carrier of the invention in contact with a substrate carrier door.

FIG. 6 is a perspective view of the upper arm link 70 and the lower arm link 72 positioned on a robot 32. The arm links 70 and 72 are in an extended position such that the robotically mounted substrate carrier door removal device 50 is positioned at a substrate carrier door 26. FIG. 6 also illustrates an alignment rod 110. Relevant SEMI specifications for substrate carrier doors include registration pins specifications. The alignment rod 110 is optionally used to exploit the registration pin feature on a SEMI specification compliant device. As discussed further below, the keys associated with the door interface mechanism 62 are inserted into the door 26 and turned to release the door 26 from the substrate carrier 20. In the turned position, the keys 64 securely hold the door 26 so that it may be moved by the robot 32.

Figure 7:
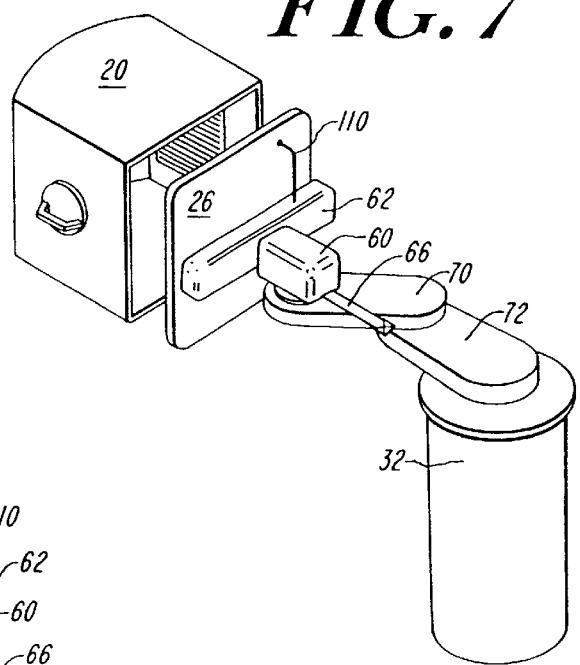
FIG. 7 illustrates the robotically mounted substrate carrier door removal device of the invention after pulling a substrate carrier door away from a substrate carrier.
Figure 8:
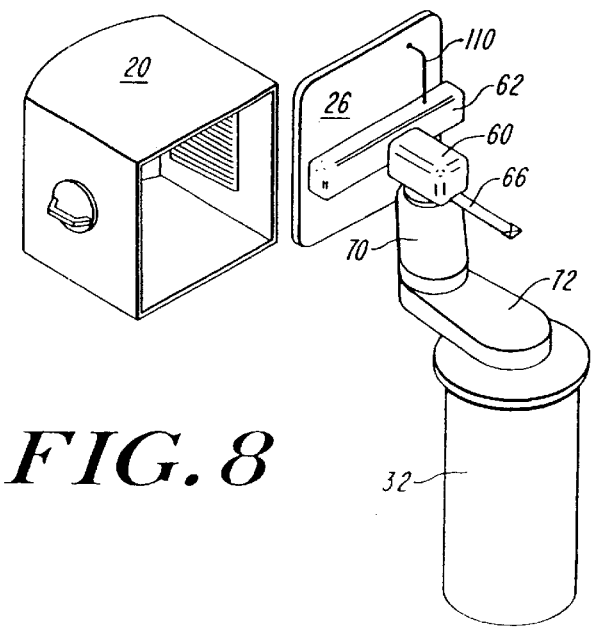
FIG. 8 illustrates the robotically mounted substrate carrier door removal device of the invention positioning a substrate carrier door for storage.

FIG. 7 illustrates the robot 32, via arms 70 and 72, removing the door 26 after it has been released from the substrate carrier 20. FIG. 8 illustrates the robot 32 positioning the door 26 for placement in a storage location, such as a frame or ledge (not shown).

Figure 9:
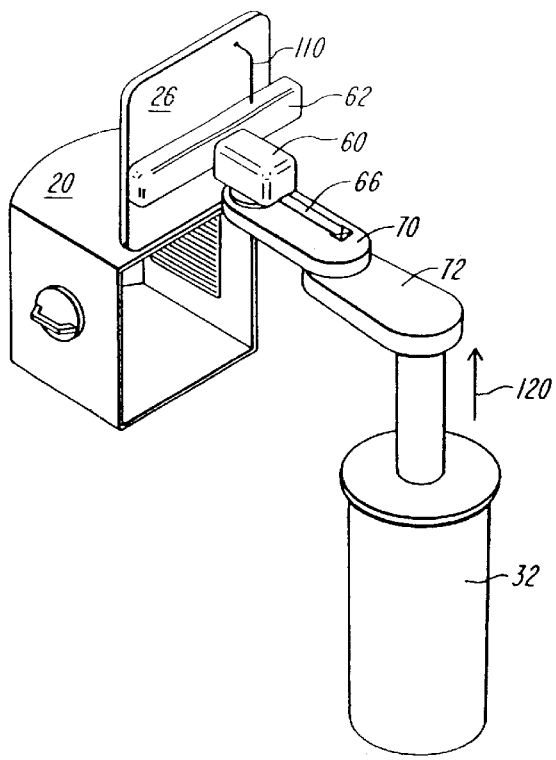
FIG. 9 illustrates the robotically mounted substrate carrier door removal device of the invention positioning a substrate carrier door above a substrate carrier for storage.
Figure 10:
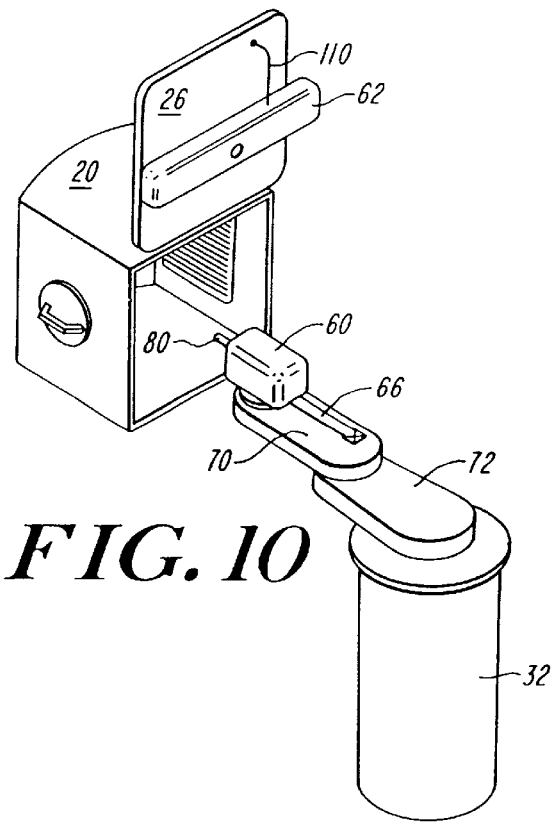
FIG. 10 illustrates the robotically mounted substrate carrier door removal device of the invention after it has released its door interface mechanism.

FIG. 9 is a perspective view of the robot 32 lifting a door 26 above a substrate carrier 20. In this instance, the z-axis motion of the robot, as shown with arrow 120, is exploited. FIG. 10 illustrates an embodiment of the invention in which the door 26 is stored with the door interface mechanism 62 attached to it. This may be accomplished by having the drive shaft 80 removably fitted within the door interface mechanism 62. In such a configuration, the radial motion of the robot 32, via arms 70 and 72, allows the drive shaft 80 to be inserted and removed from the door interface mechanism 62.

Figure 11:
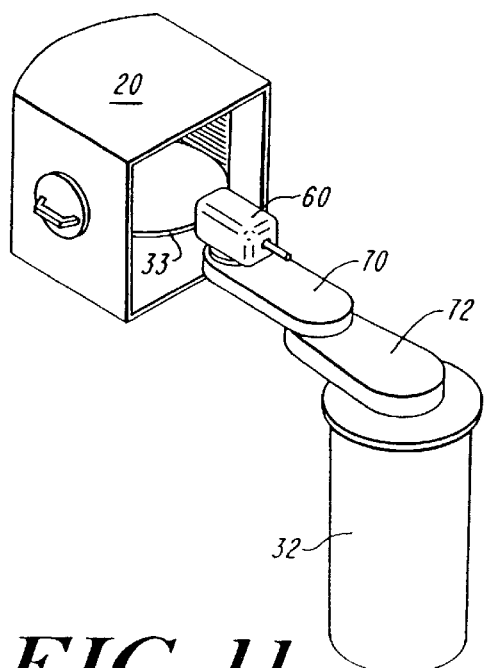
FIG. 11 illustrates the robotically mounted substrate carrier door removal device of the invention handling a substrate stored in a substrate carrier.

FIG. 11 illustrates the drive mechanism 60 on top of the upper arm link 70 so that the substrate paddle 66 can be used to remove a substrate 33 from the substrate carrier 20. By leaving the door interface mechanism 62 attached to the door, as shown in FIG. 10, the robot 32 has a smaller footprint with payload as it passes through its motions in processing a substrate 33.

Figure 12:
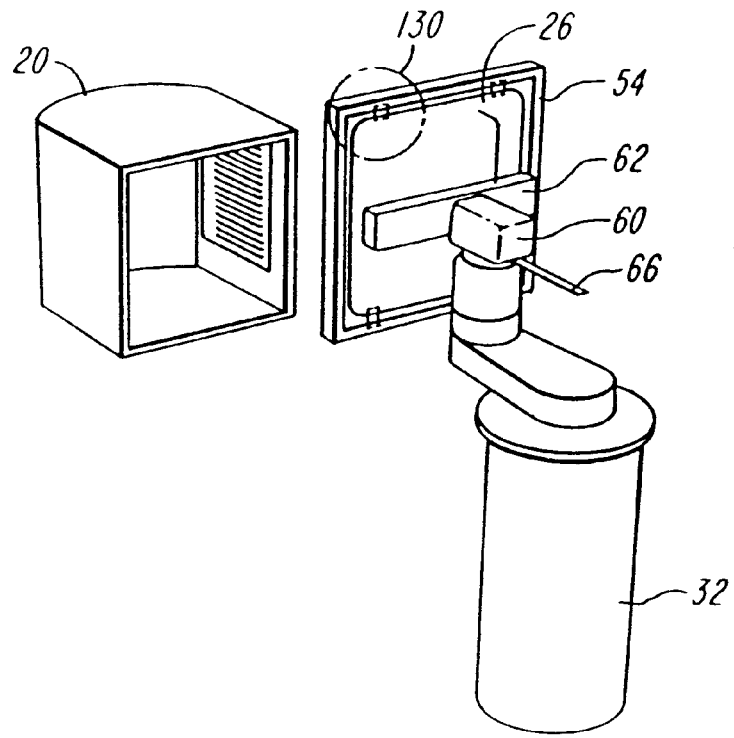
FIG. 12 illustrates the robotically mounted substrate carrier door removal device of the invention storing a substrate carrier door in a frame.
Figure 13:
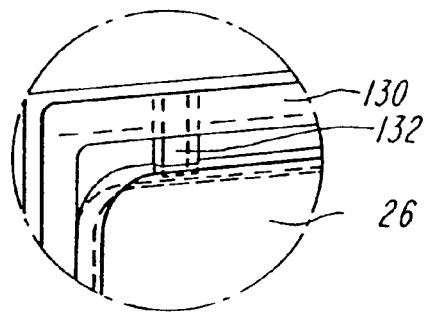
FIG. 13 is an enlarged view of a latch mechanism associated with the frame of FIG. 12.

FIG. 12 illustrates the robot 32 positioning a door 26 into a frame 54. Region 130 of FIG. 12 is enlarged in FIG. 13. FIG. 13 illustrates a latch 132 that may be used to lock the door 26 into the frame 130.

FIG. 14 illustrates the robot 32 having installed the door 26 into frame 54 and then releasing the door interface mechanism 62, such that it remains affixed to the door 26. FIG. 15 generally corresponds to FIG. 14, but the door interface mechanism 62 is illustrated as remaining attached to the drive mechanism 60 after the door 26 has been inserted into the frame 54.

FIG. 16 illustrates the door 26 being positioned on a ledge 52. The operation of the ledge 52 may be supplemented with a vacuum pull on the door 26.

Figure 17:
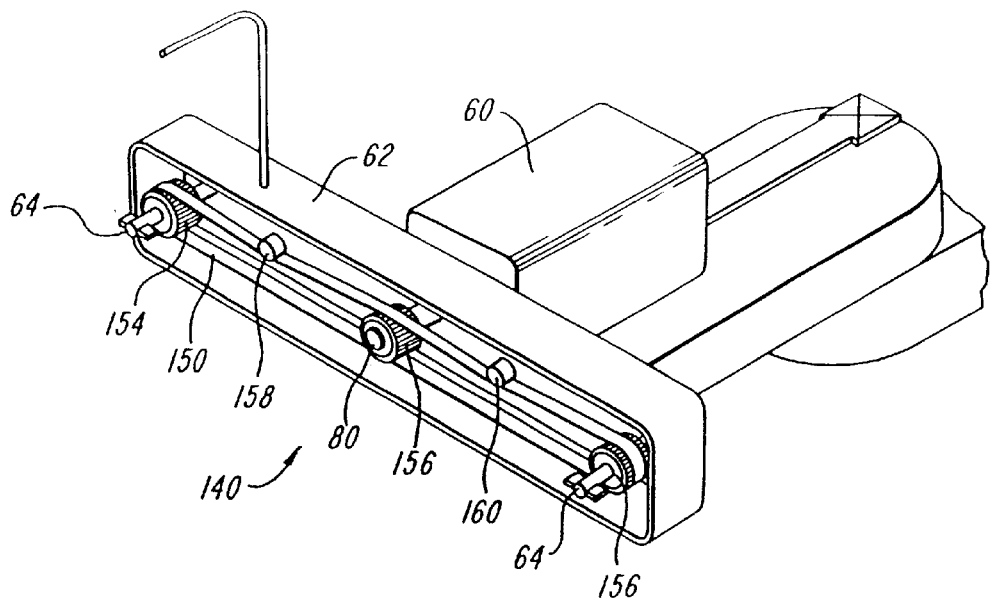
FIG. 17 illustrates a single belt door key control assembly in accordance with an embodiment of the invention.

FIG. 17 illustrates a door key control assembly 140. In this embodiment, the door key control assembly 140 is implemented with a single belt 150. A gear shaft 152 is positioned over shaft 80, which is received from the drive mechanism 60. The shaft 80 is selectively rotated, causing the belt 150 to turn pulleys 154 and 156, which causes door keys 64 to rotate. Tension rollers 158, 160 may be used for smoother transmission characteristics.

Figure 18:
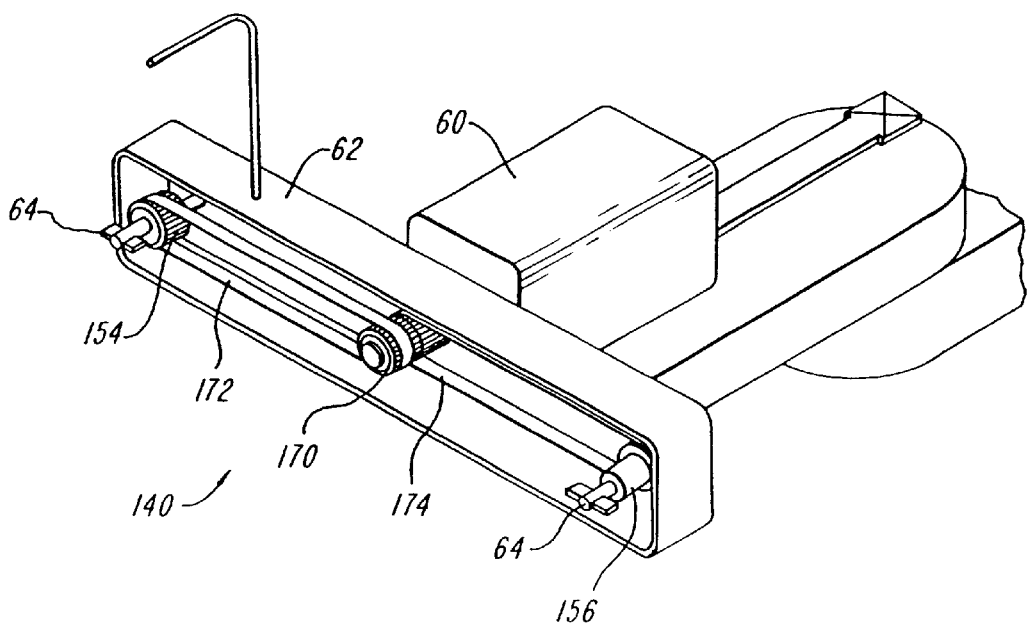
FIG. 18 illustrates a dual belt door key control assembly in accordance with an embodiment of the invention.

FIG. 18 illustrates a door key control assembly 140 implemented in a dual belt configuration. The assembly 140 has a first belt 172 and a second belt 174 for respectively driving pulleys 154 and 156. Once again, this causes the keys 64 to selectively rotate to release the door and then hold the door.

Figure 19:
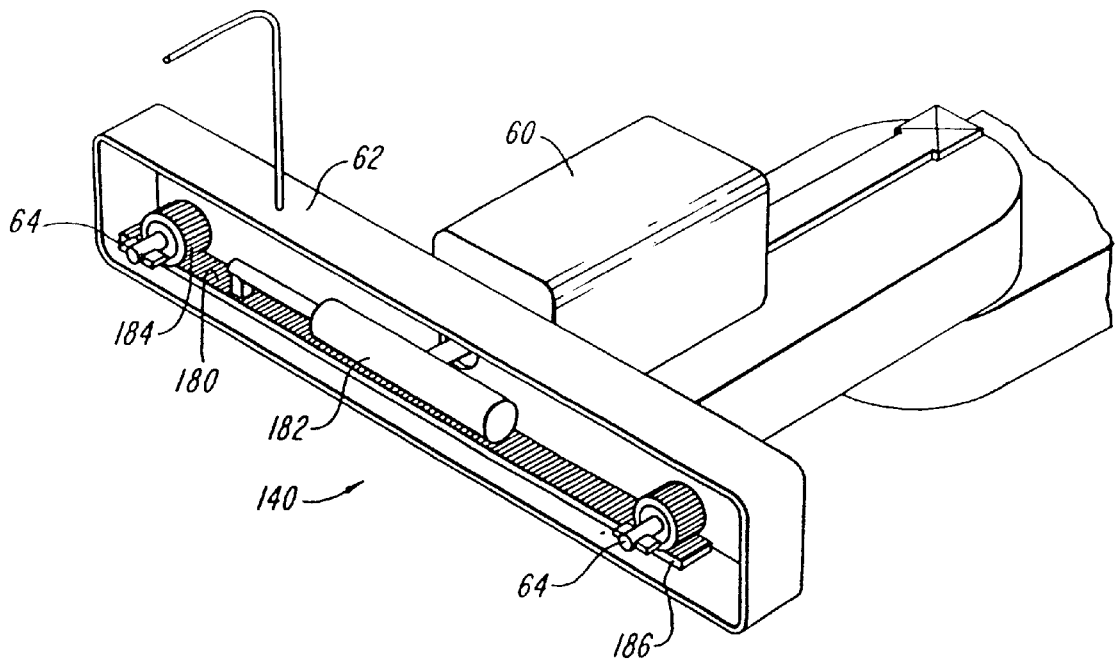
FIG. 19 illustrates a rack and pinion door key control assembly in accordance with an embodiment of the invention.

FIG. 19 illustrates a door key control assembly 140 implemented in a rack and pinion configuration. A rack 180 is driven by a pinion 182, which is controlled by the shaft 80 from the drive mechanism 60. This motive action causes pulleys 184 and 186 to rotate, thereby turning keys 64.

Figure 20:
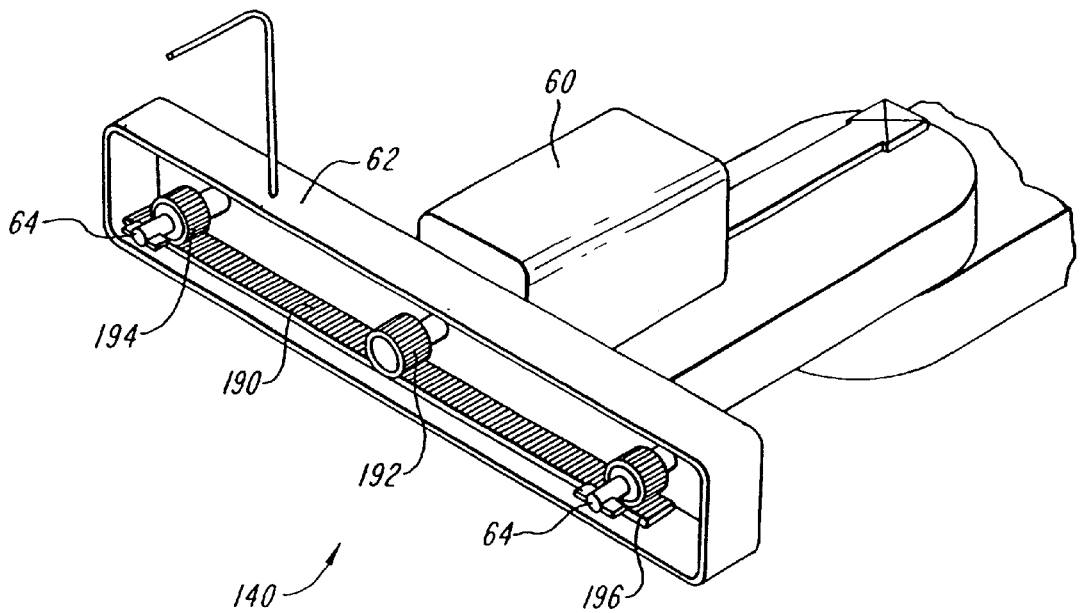
FIG. 20 illustrates a rack door key control assembly in accordance with an embodiment of the invention.

FIG. 20 illustrates a door key control assembly 140 implemented in a rack configuration. A rack 190 is driven by geared shaft 192. This causes pulleys 194 and 196 to rotate, thereby selectively turning keys 64.

Figure 21:
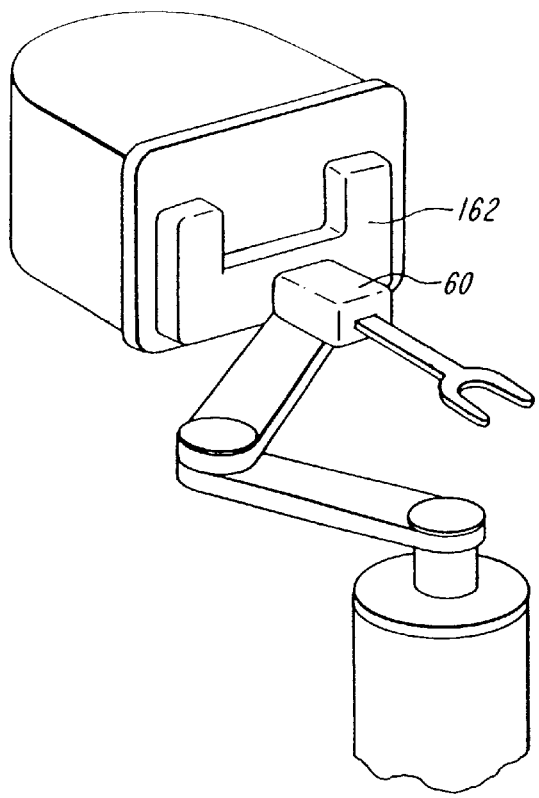
FIG. 21 illustrates a further embodiment of a rotatable substrate carrier door removal device.
Figure 22:
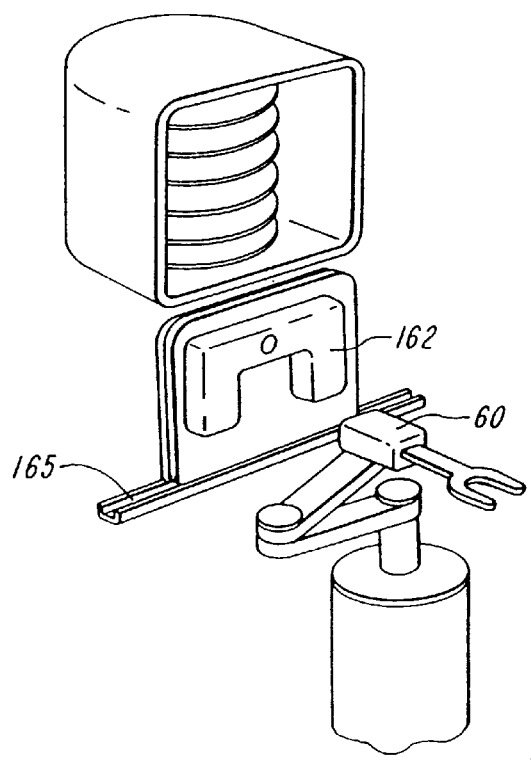
FIG. 22 illustrates the device of FIG. 21 with the door rotated and stored on a ledge.

A further embodiment of a door interface mechanism 162 is illustrated in FIGS. 21 and 22. In this embodiment, the door interface mechanism is U-shaped so that the aperture 164 for receiving the drive shaft 80 is located near the bottom of the door. The drive shaft is rotatable by 180°, thereby rotating the door 180°. The robot arm is then lowered to deposit the door on, for example, a ledge 165. Because the door has been rotated, the aperture 164 at which the door interface mechanism attaches to the door is in a relatively higher position. Thus, the robot does not have to travel as great a vertical distance to deposit the door on the ledge. This embodiment, accordingly, allows the robot to provide the necessary clearance of the opening while minimizing the amount of required vertical motion. Rotation of the drive shaft also causes rotation of the door keys by any suitable mechanism, not illustrated in FIGS. 21 and 22.

Figure 23:
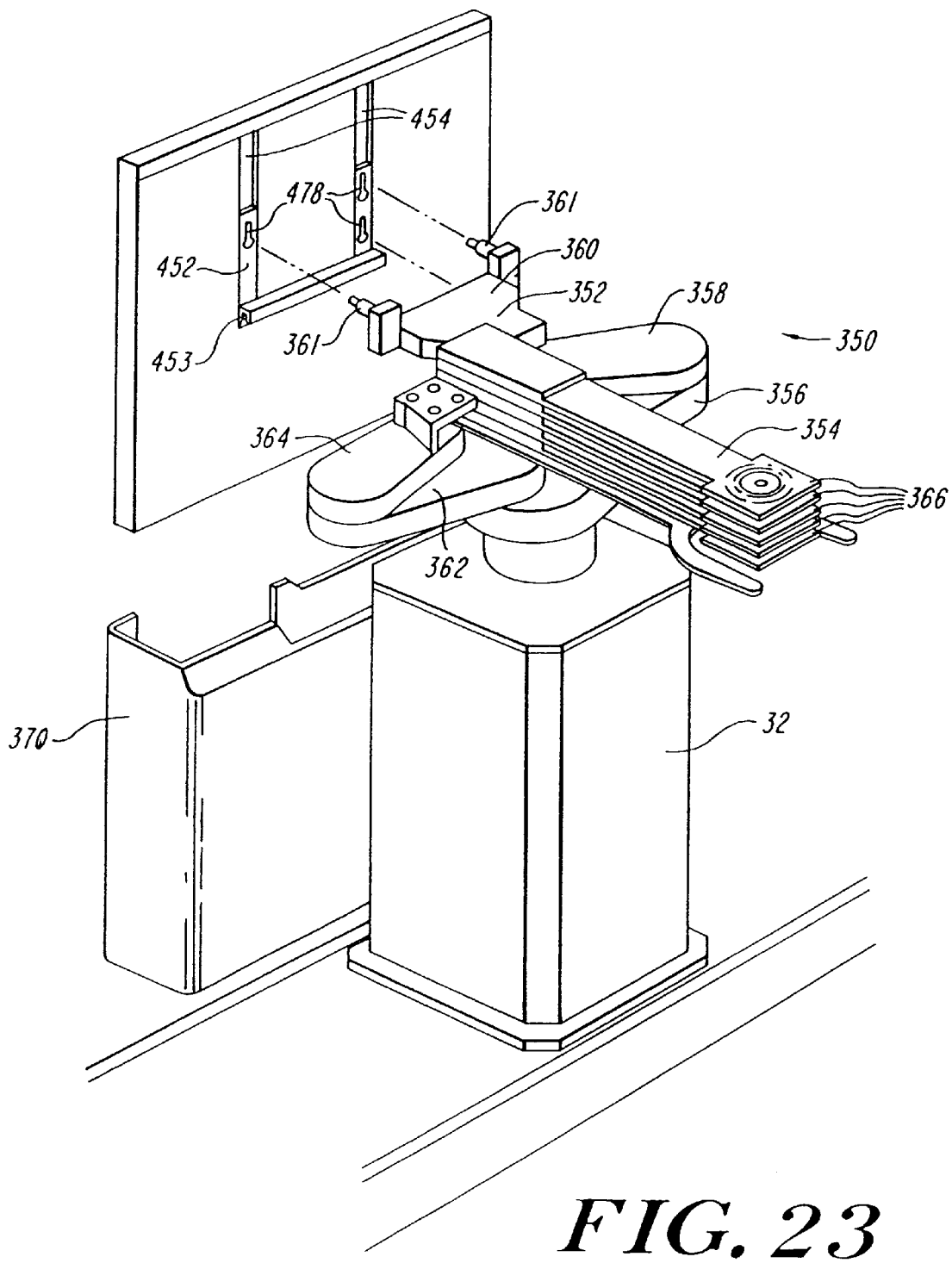
FIG. 23 illustrates a robotically mounted substrate carrier door removal device and a batch end effector assembly.

FIG. 23 illustrates a robot 350 having a door removal device 352 and a batch end effector 354. The door removal device includes a lower arm link 356 and an upper arm link 358, as described previously. A door interface mechanism 360, described further below, is provided on the end of the upper arm link 358. The batch end effector includes a lower arm link 362 pivotally attached to the lower arm link 356 of the door removal device and an upper arm link 364 pivotally attached to the lower arm link 362. The batch end effector includes a plurality of substrate paddles 366 stacked vertically. The spacing between each paddle is the same as the spacing between substrates stored in the carrier. In this embodiment, the door is stored in a door parking assembly 370 provided below the opening, described more fully below.

Figure 24:
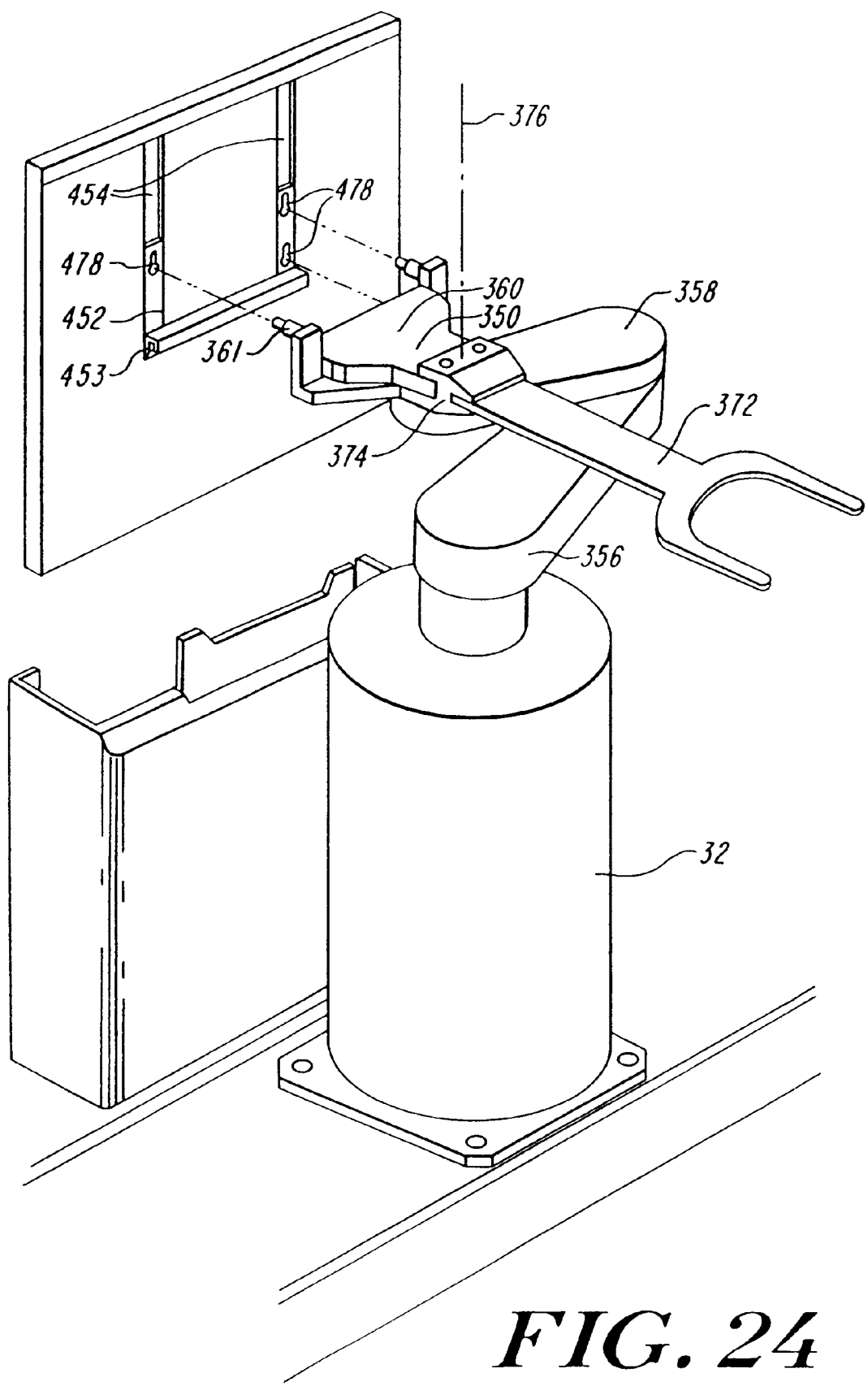
FIG. 24 illustrates a robotically mounted substrate carrier door removal device and an end effector with yaw motion.
Figure 25:
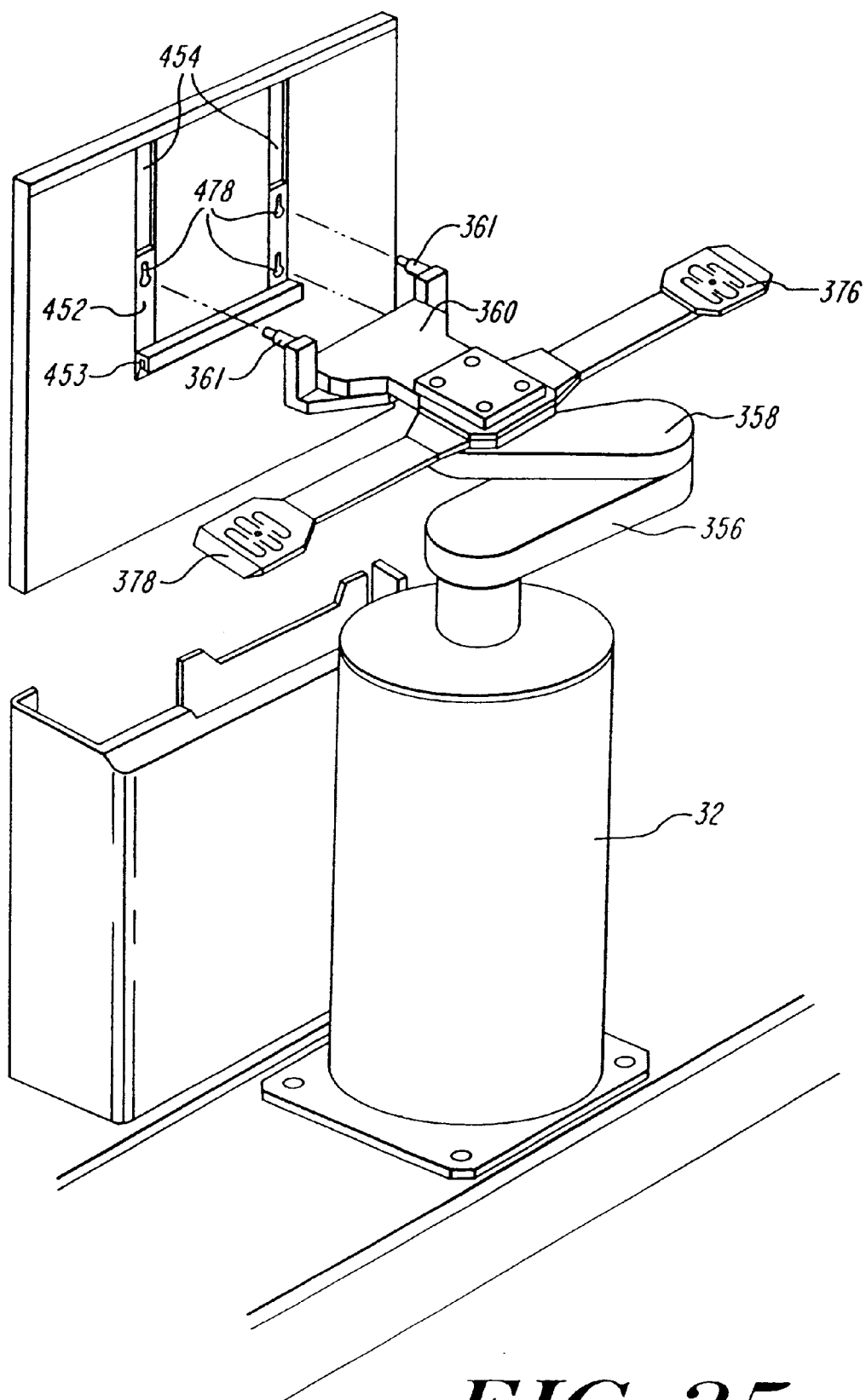
FIG. 25 illustrates a robotically mounted substrate carrier door removal device and two end effectors.

FIG. 24 illustrates a robot having a door removal device 350 similar to that in FIG. 23. The end effector 372 is attached to the upper arm link 358 with a mechanism 374 that provides rotation about a vertical axis 376. In this manner, a yaw motion may be imparted to the end effector. FIG. 25 illustrates a robot having two end effectors 376, 378 located 180° from each other. Each end effector is located 90° from the door interface mechanism 360.

Figure 26:
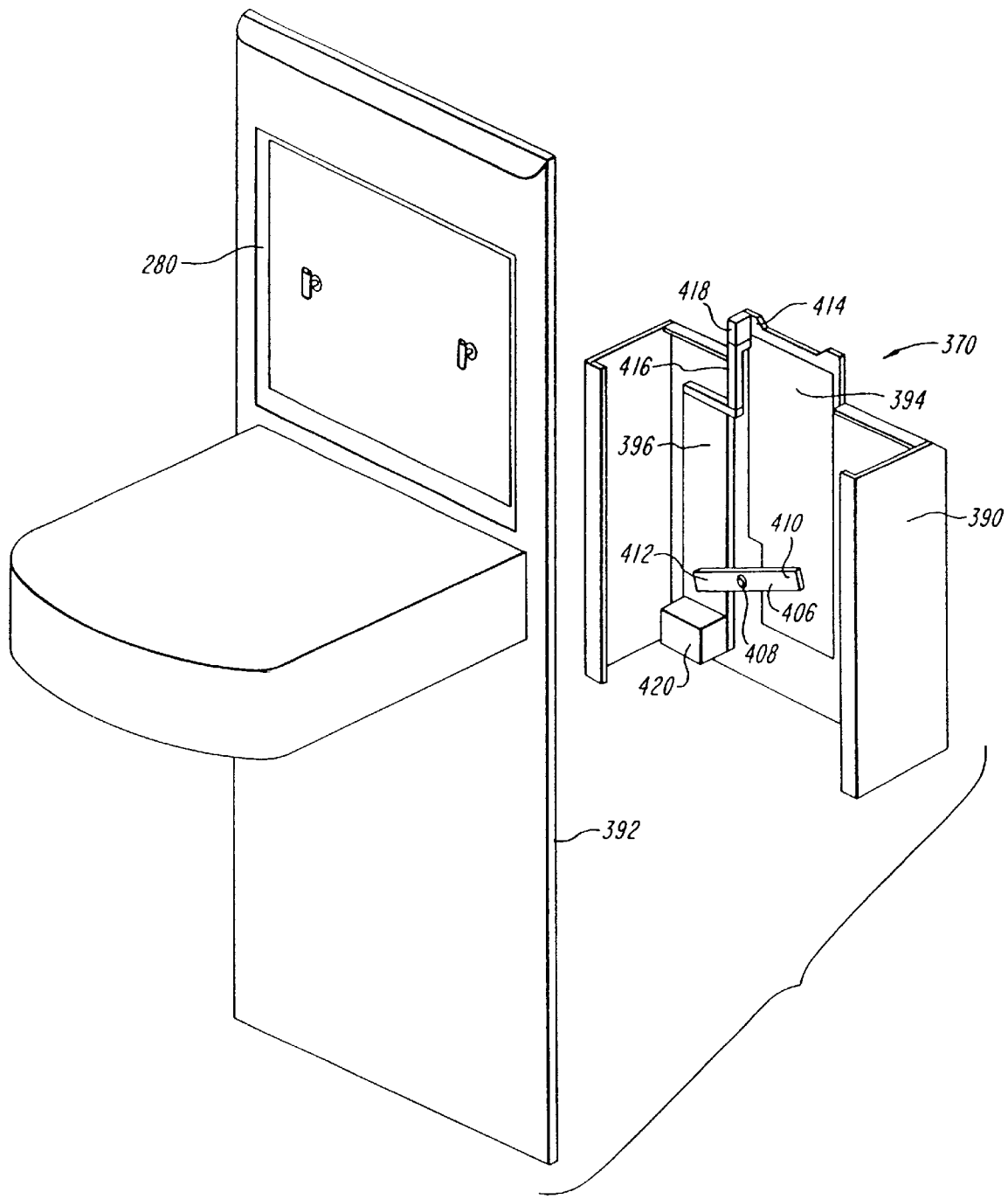
FIG. 26 illustrates partially exploded view of a door parking assembly according to the invention.
Figure 27:
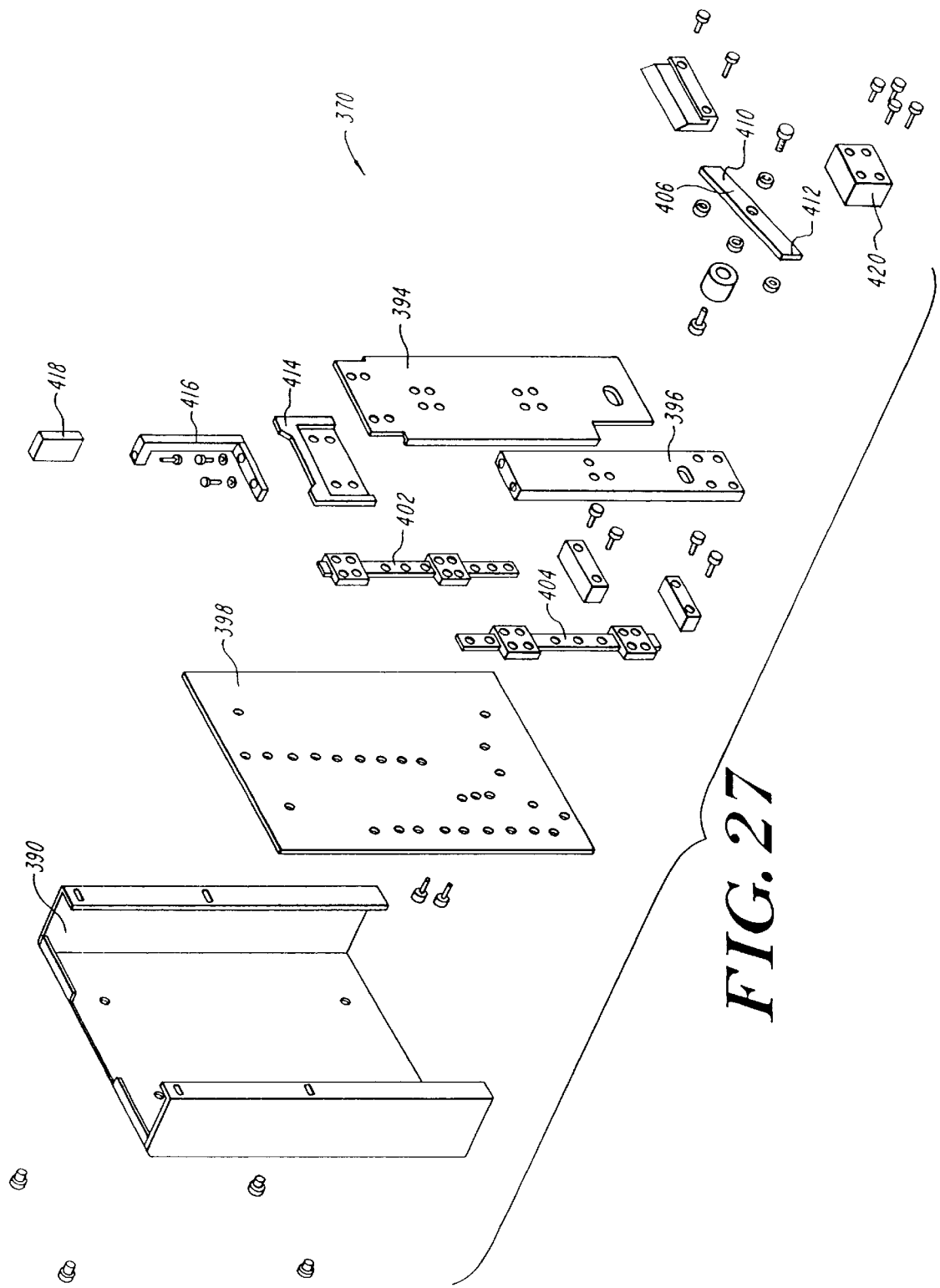
FIG. 27 illustrates an exploded view of the door parking assembly of FIG. 26.

FIGS. 26 and 27 illustrate more particularly the door parking assembly 370 shown generally in FIGS. 23–25. A cover 390 is mounted to the wall 392 inside the chamber. A door lifter plate 394 and a press arm plate 396 are mounted for vertical linear motion along respective linear rails 402, 404 mounted to the cover via a plate 398. A pivot arm 406 is mounted to the cover about a pivot point 408 between the door lifter plate and the press arm plate. One end 410 of the pivot arm is attached to the door lifter plate and the other end 412 of the pivot arm is attached to the press arm plate. In this manner, when the press arm plate is moved vertically upward, the door lifter plate moves vertically downward and vice versa. A door lifter jaw 414 is mounted to the top of the door lifter plate and receives a door interface hanger 453 on the port door. A press arm bracket 416 and press arm block 418 are mounted to the top of the press arm plate 396. The press arm plate also includes a counterweight 420 attached near its bottom edge. In operation, the door is lowered between the cover and the wall and comes to rest at the lowest point of travel of the door lifter plate 394. In this position, the door is stowed in out of the way and protected by the cover. When the door must be returned to the port to close the port, door interface mechanism presses on the press arm plate, thereby lifting the door lifter plate and the door. The door is moved into a position where the door interface mechanism can grasp the door to move it back to the port.

Figure 28:
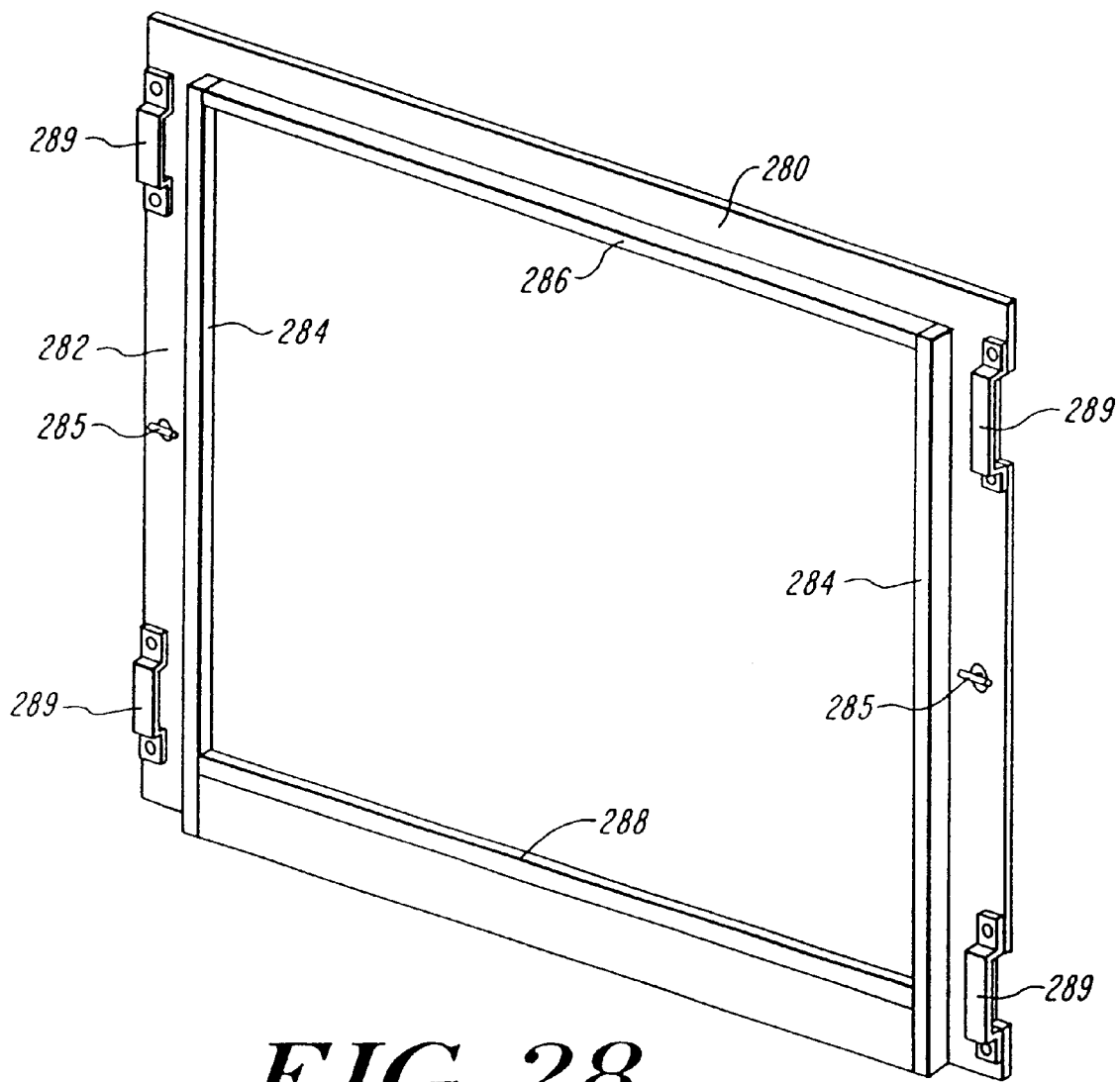
FIG. 28 illustrates a safety bezel.

A safety bezel 280 is illustrated in FIG. 28. The bezel includes a plate 282 that is fastened to the wall around the opening. Vertical side bars 284, an upper bar 286 and a lower bar 288 are provided for receiving a door. The bezel plate 282 is mounted on pivot points 285 that allow the plate to float and move slightly with respect to the wall if touched by an object, such as a finger. Switch lever housings 289 are provided along the edges that, upon motion of the plate 282, contact and actuate adjacent switches (not shown). Thus, if an object comes between the substrate carrier and the safety bezel, the safety bezel moves, causing the switch lever housings to actuate the switches. Once actuated, the switches stop the system and prevent motion of the substrate carrier against the safety bezel. In this manner, objects are not caught or pinched between the carrier and the bezel.

Figure 29:
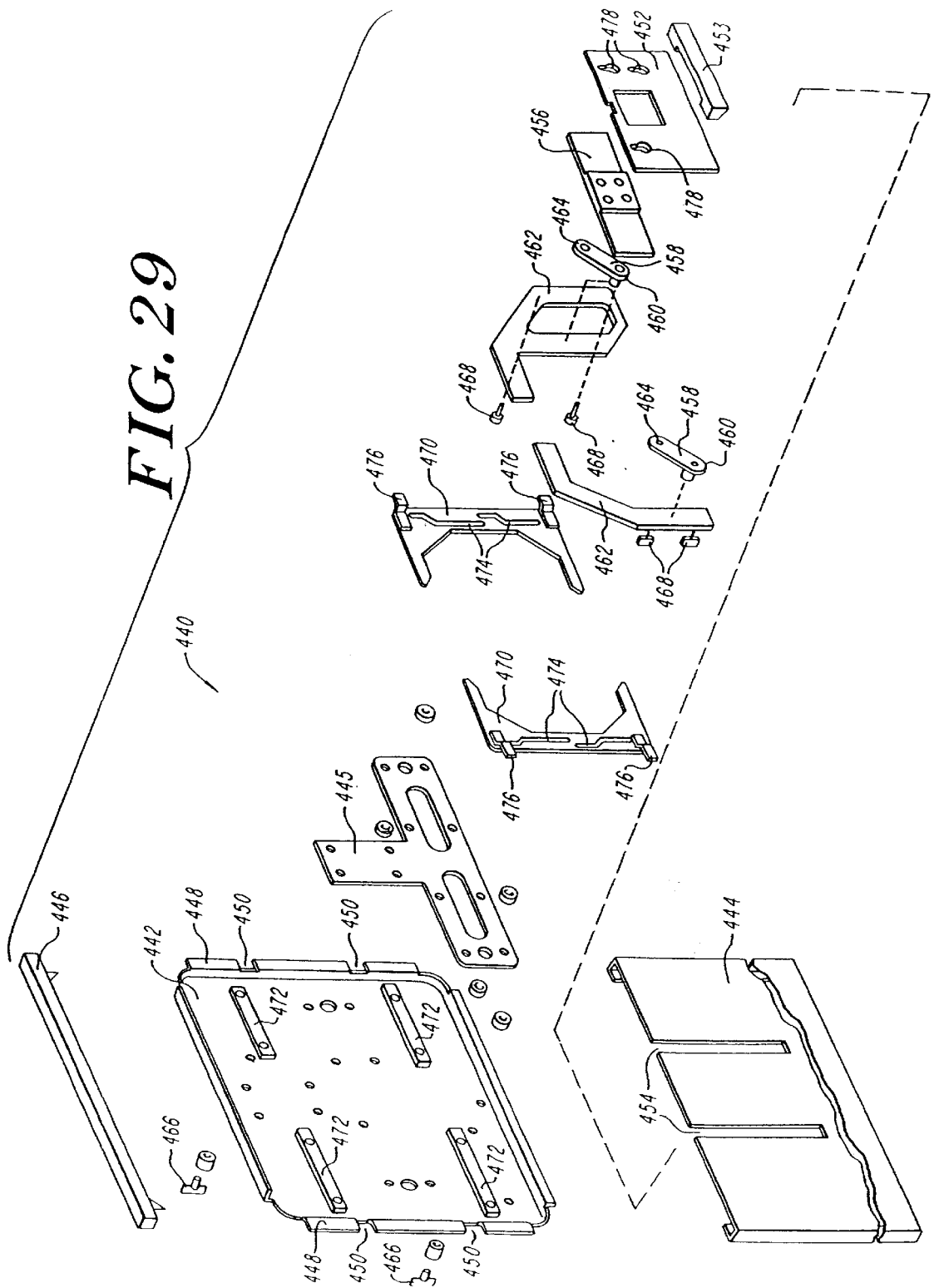
FIG. 29 illustrates an exploded view of a further embodiment of a coupling assembly.
Figure 35:
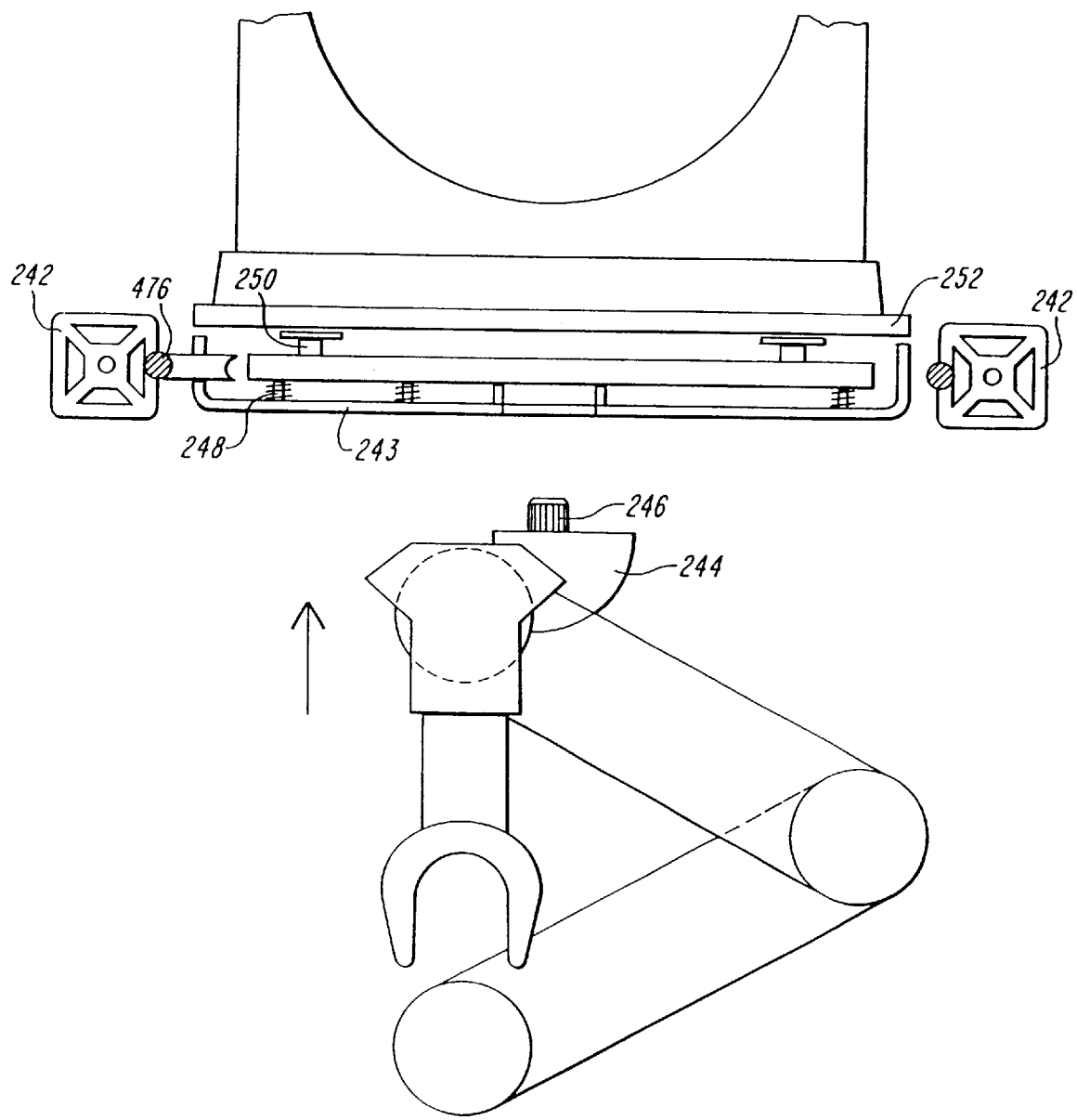
FIG. 35 illustrates a track-mounted door assembly.

FIG. 29 illustrates a further mechanism for passively coupling a port door and carrier door and for attaching a port door 440 to a frame, such as that of FIG. 35. The port door includes an inner skin 442, outer skin 444, a back bone plate 445, and a top rail 446. The inner skin includes side tabs 448 to allow assembly to the outer skin 444. The spaces 450 provided on the inner skin 442 allow reciprocating motion of latch tabs 476 therethrough. Between the inner and outer skins, an interface plate 452 is mounted for vertical motion along slots 454 in the outer skin. A slide bracket 456 is fastened to the interface plate 452. Two lever keys 458 are fastened to the slide bracket for pivoting motion at first ends 460. The first ends are also pivotally attached to two arm plates 462. Second ends 464 of the lever keys are pivotally fastened to the inner skin 442 and to associated door keys 466. Two cam followers 468 are attached to each arm plate 462. Two slide plates 470 are provided for horizontal motion along rails 472 fastened to the inner skin. Two cam slots 474 on each slide plate receive the cam followers 468 on each arm plate 462. Latch tabs 476 or rollers on each slide plate fit through the slots 450 on the side tabs 448 of the inner skin 442 into a frame when the slide plates 470 are extended horizontally past the side tabs 448.

The mechanism converts vertical motion of an interface plate 452 to horizontal motion of slide plates 470. Vertical motion of the interface plate moves the first ends 460 of the lever arms 458 vertically along an arc, causing the cam followers 468 to travel along the cam slots 474 in the slide plates 470. The slide plates thereby move horizontally. The door interface mechanism on the robot includes pins 361 (FIGS. 23–25) that fit within openings 478 on the interface plate 452 to move the interface plate vertically through the slots 454 on the door outer skin 444. When extended out, the latch tabs 476 fit into frame members 242 to hold the door during normal operation (see FIG. 35). Vertical movement of the first ends 460 of the lever arms 458 also causes rotation about the second ends 464, rotating the door keys 466 to rotate to lock or unlock the port door to the carrier door.

Figure 30:
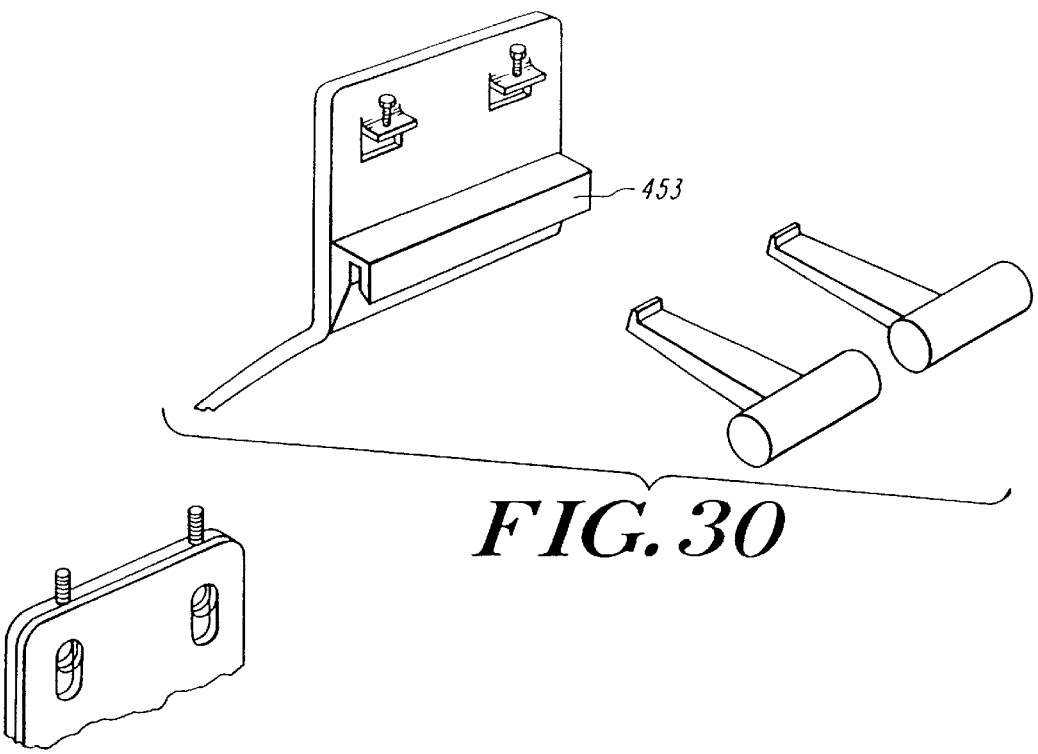
FIG. 30 illustrates a sag adjustment assembly.
Figure 31:
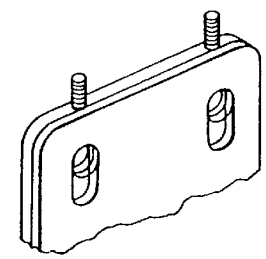
FIG. 31 illustrates a further embodiment of a sag adjustment assembly.

FIGS. 30 and 31 illustrate mechanisms for adjusting the sag or vertical alignment of the interface hanger 453 with respect to the door interface mechanism with, for example, set screws. This alignment is required to account for the differences between the doors and the door interfaces mechanism.

Figure 32:
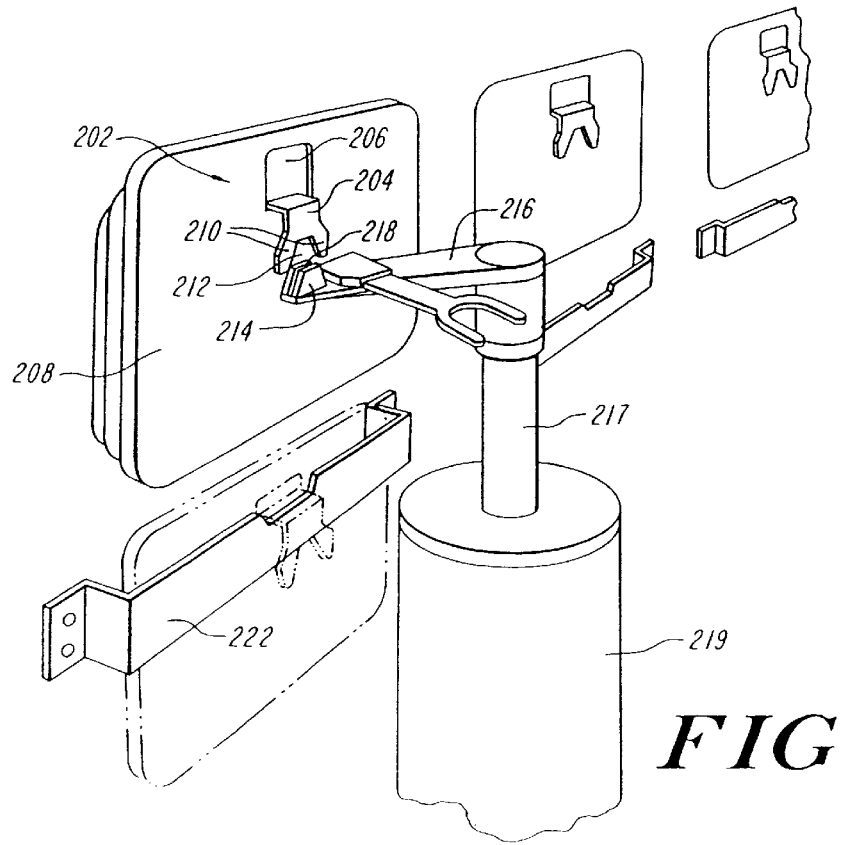
FIG. 32 illustrates a further embodiment of a door interface mechanism.
Figure 34:
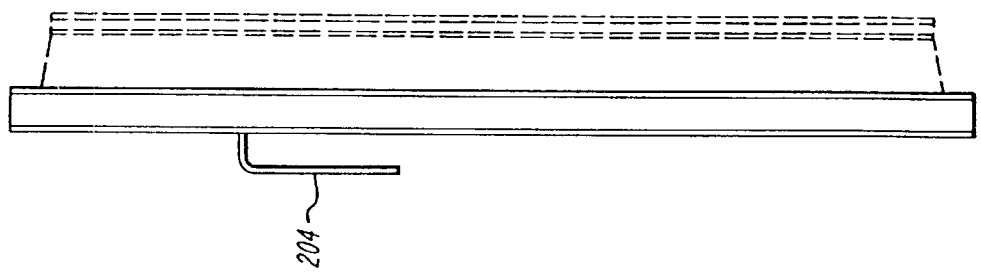
FIG. 34 is a side view of the door assembly of FIG. 33.
Figure 33:
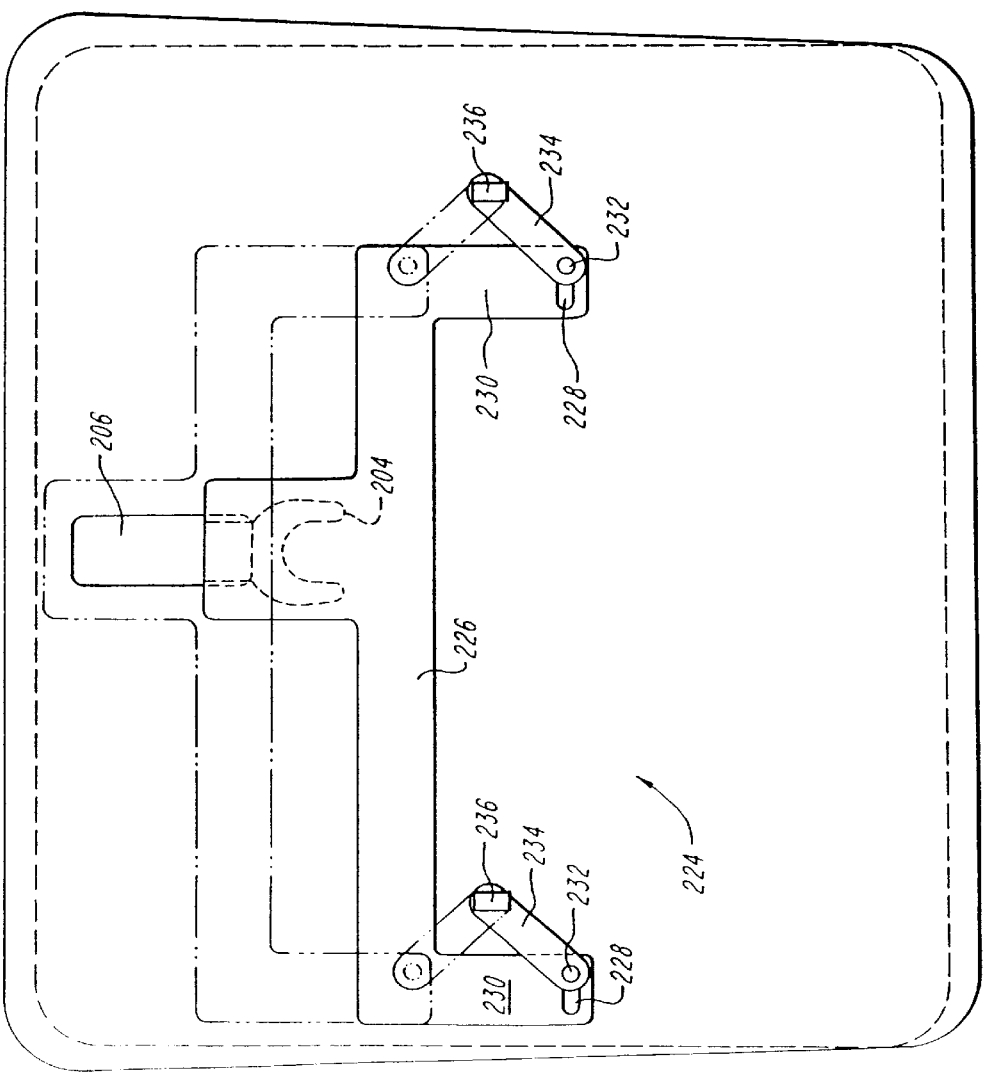
FIG. 33 illustrates a door key control assembly operative with the door interface mechanism of FIG. 32.

FIGS. 32–34 illustrate another embodiment of a door interface mechanism 202. The mechanism includes a hook 204 vertically movable in an opening 206 in the port door 208. The hook has a pair of depending forked arms 210 that forms a downwardly opening recess 212. A lifting wedge 214 having a shape corresponding to the recess is provided on the end of the robot arm link 216. The lifting wedge includes a slot 218 along its sides into which the forked arms 210 fit when the lifting wedge fits into the recess on the hook. The robot arm link 216 is pivotally mounted to a cylinder 217 that is vertically movable in the pedestal 219. As the robot is raised vertically, the hook rises in the slot, activating a door key control assembly (see FIG. 33) to turn the door keys described previously. The robot arm link 216 pivots to move the coupled doors away from the opening and is then lowered to position the doors on a bar 222 fastened to the wall below the opening. The hook fits over the bar, thereby retaining the doors on the bar.

Referring to FIG. 33, the door key control assembly 224, which is operative to convert linear motion to rotary motion, includes a bar 226 that extends along the opposite side of the port door. Slots 228 are provided in depending ends 230 of the bar. A cam follower 232 rides in each slot 228. Each cam follower is pivotally connected to an arm 234 that is in turn connected to an associated door key 236 for pivoting about an axis through the door key. As the hook 204 is lifted by the robot arm on the other side of the port door, the bar 226 is lifted, raising the cam followers 232, which also slide in their respective slots 228. The arms 234 in turn pivot about their respective axes through the door keys 236, causing the door keys to rotate, locking the carrier door to the port door. Other linear-to-rotary conversion mechanisms are possible.

FIG. 35 illustrates a pair of frame members 242 mounted along the wall adjacent the port door 243. The robot arm drive mechanism 244, with drive shaft 246, pushes against a spring-biased mechanism 248 forcing a door key control assembly 250 toward the carrier door 252. The drive shaft 246 is rotated, causing the door keys to turn and latch to the carrier door 252. The robot arm is then retracted, causing the coupled doors to pull back. The doors are then lowered by the robot arm to the storage position.

Figure 36:
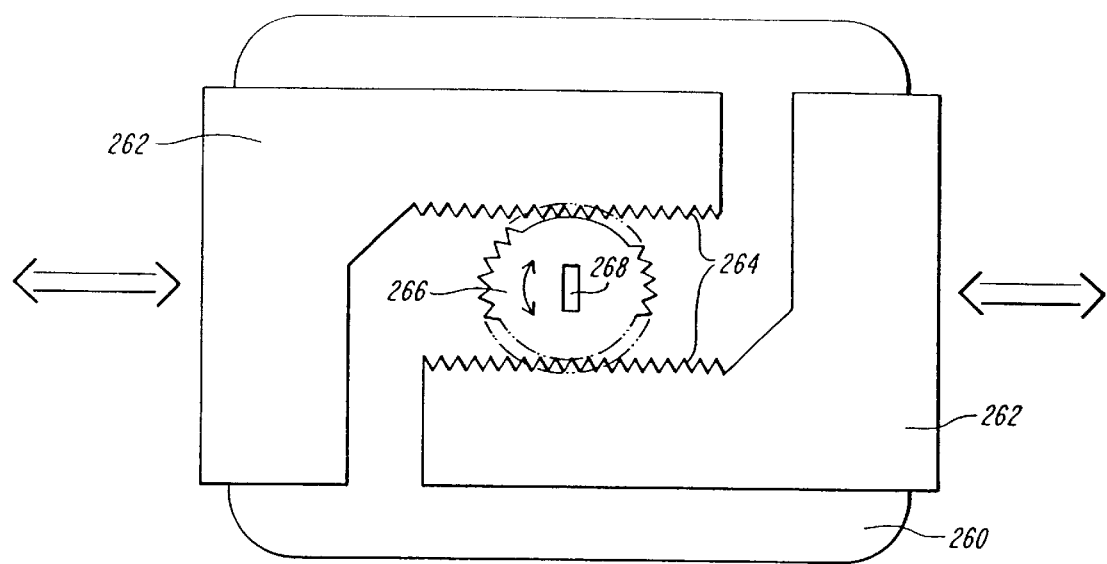
FIG. 36 illustrates a further embodiment of a track mounted door assembly.
Figure 37:
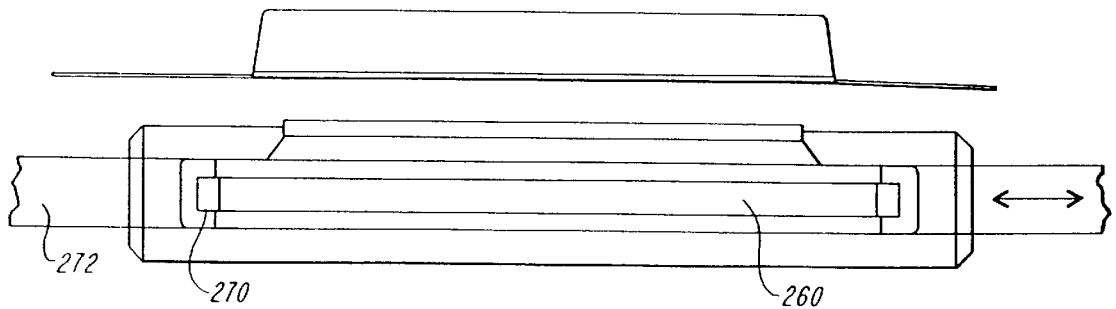
FIG. 37 illustrates a top view of the track-mounted door assembly of FIG. 36.

FIGS. 36 and 37 illustrate an alternative mechanism for track-mounted movement of the coupled doors. The port door 260 includes two L-shaped members 262 mounted to the door for horizontal motion. Opposed faces 264 have gear teeth thereon that mesh with a gear 266 mounted for rotational motion between the L-shaped members. The drive mechanism engages with an aperture 268 on the gear to rotate the gear. Rotation of the gear thereby causes horizontal linear motion of the L-shaped members 262. The L-shaped members travel along vertical tracks or trolley guides 270 along each side of the opening to a bar or shelf 272 below the opening for storage.

Figure 38:
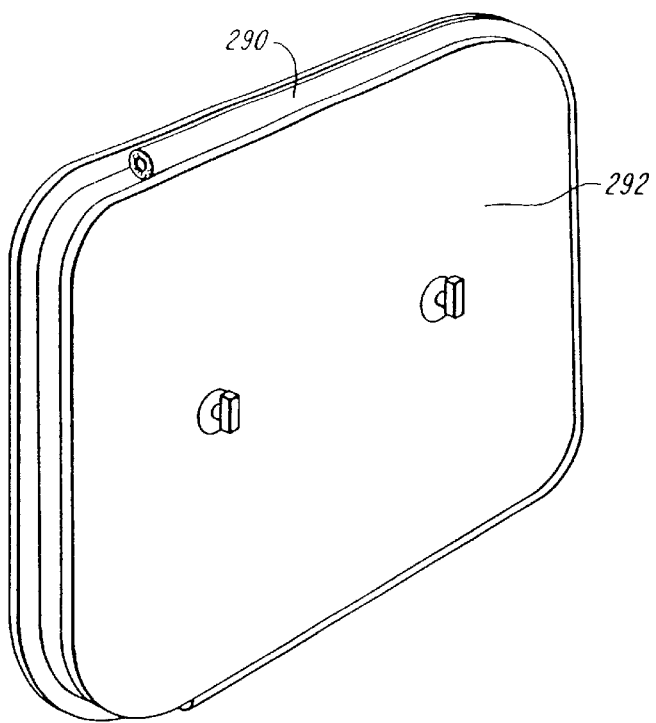
FIG. 38 illustrates an air bladder gasket.
Figure 39:
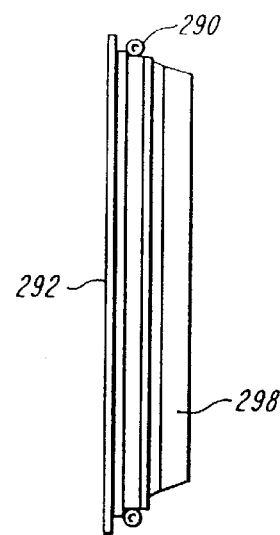
FIG. 39 illustrates a side view of the air bladder gasket of FIG. 38.
Figure 40:
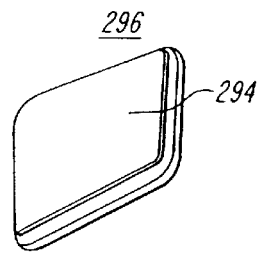
FIG. 40 illustrates a view of an opening with the air bladder gasket of FIG. 38.

FIGS. 38–40 illustrate a further embodiment in which an air bladder gasket 290 is provided to retain the port door 292 within the opening 294 in the wall. The bladder surrounds the circumference of the door and is supplied with pressurized air, which holds the door in place. The bladder is depressurized to remove the port door from the opening 294 after coupling to a carrier door 298.

Figure 41:
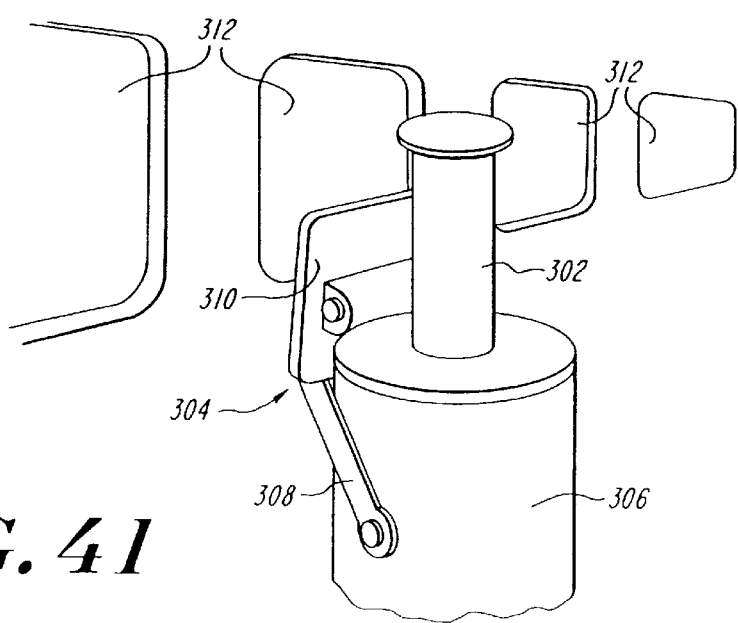
FIG. 41 illustrates a robot-mounted door storage assembly.

FIG. 41 schematically illustrates a robot 302 having a door opening and storage mechanism 304 mounted to the robot pedestal 306. The mechanism includes a suitable linkage 308, such as a bar or a four-arm linkage, that moves up to reach the door 310. The opening mechanism may operate in any of the manners described herein to open the door. The linkage moves downwardly to the region around the pedestal and retains the door in that location. The robot is able to move along a track to various positions in front of other openings 312 or processing stations, and the door 310 is carried along with the robot 302 as the robot travels.

Figure 42:
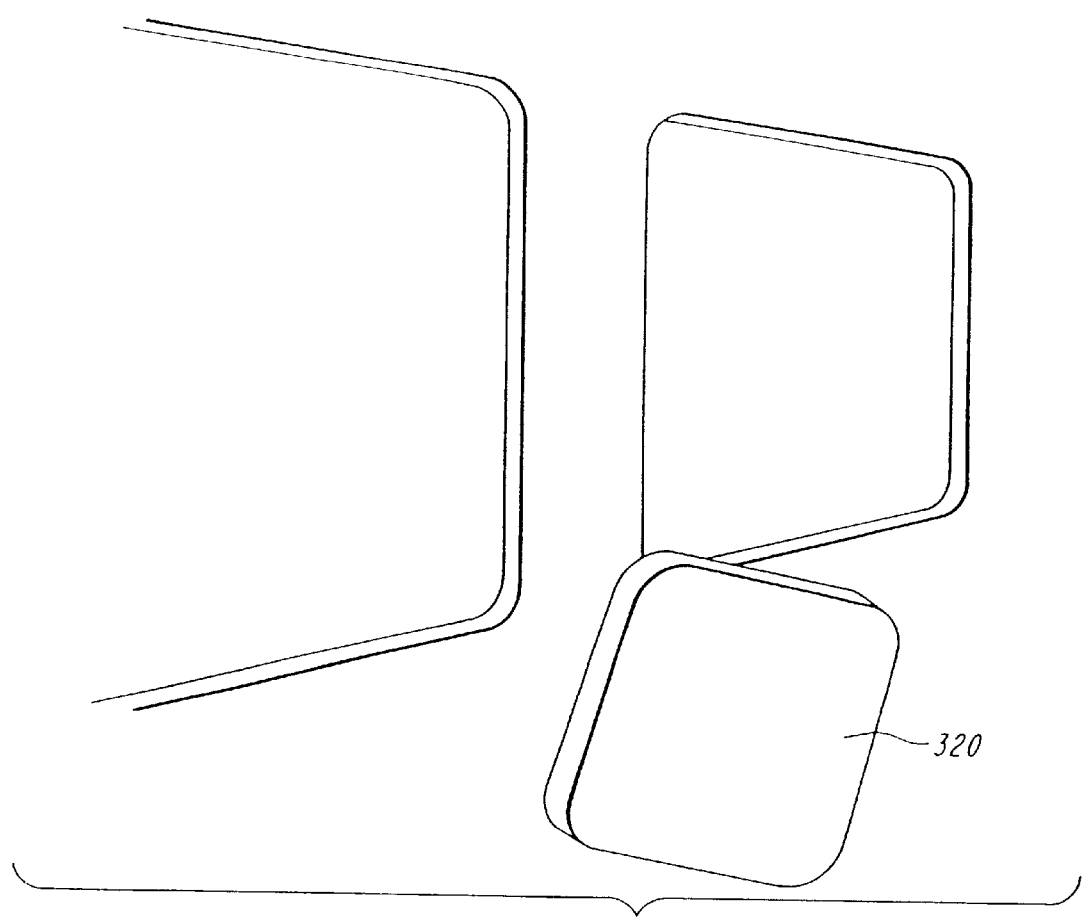
FIG. 42 illustrates a pivotable door assembly.

FIG. 42 illustrates a further embodiment in which the port door 320 is pivotally mounted to the wall about a pivot point. The door is rotated out of the way to allow access to wafers in the carrier.

Figure 43:
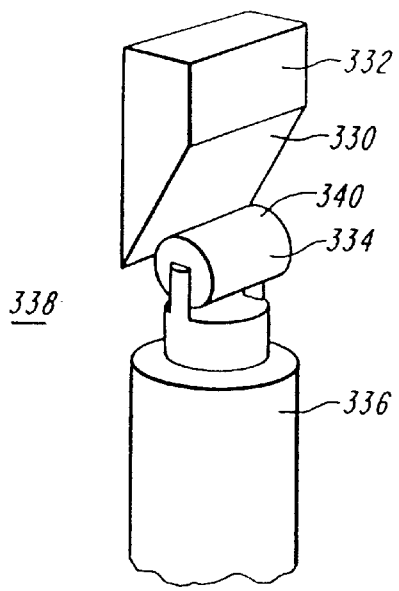
FIG. 43 illustrates a roller assembly door storage device.
Figure 44:
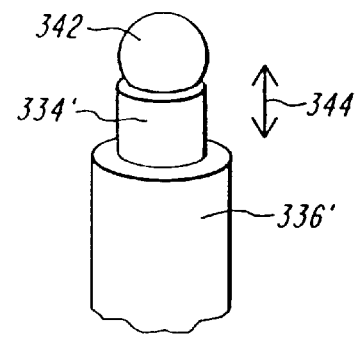
FIG. 44 illustrates a further embodiment of the roller assembly door storage device of FIG. 43.

FIG. 43 schematically illustrates an embodiment in which a ramped surface 330 is provided on the port door 332. Below the port door opening, a roller assembly 334 is mounted on a pedestal 336. The ramped surface slides between the roller assembly and the wall 338 and is retained there. In one embodiment, the roller assembly includes a cylindrical element 340. In an alternative embodiment, shown in FIG. 44, the roller assembly 334' includes a ball 342 rollably mounted on the pedestal 336'. In either embodiment, the roller assembly can be made vertically movable, indicated by the arrow 344 in FIG. 36.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A substrate carrier door removal assembly positioned on a robot, comprising:
   a door interface mechanism including a door key control assembly; and
   a drive mechanism connected to the door interface mechanism and operative to provide mechanical control of said door key control assembly to manipulate a door key to release a substrate carrier door coupled to a port door forming a door assembly from a substrate carrier accessible through a wall and transport the door assembly to a position on the wall selected from above the substrate carrier opening, beside the substrate carrier opening, and below the substrate carrier opening.

2. The assembly of claim 1, further comprising a robot attached to the drive mechanism.

3. The assembly of claim 2, further comprising a robot transport mechanism attached to the robot to sequentially position the robot at a plurality of substrate carrier doors.

4. The assembly of claim 2, further comprising a vacuum link between the robot and the drive mechanism and an electrical connection between the robot and the drive mechanism.

5. The assembly of claim 1, wherein the door key control assembly includes a single belt transmission system to control the door key.

6. The assembly of claim 1, wherein the door key control assembly includes a dual belt transmission system to control the door key.

7. The assembly of claim 1, wherein the door key control assembly includes a rack and pinion transmission system to control the door key.

8. The assembly of claim 1, wherein the door key control assembly includes a rack transmission system to control the door key.

9. The assembly of claim 1, wherein the door key control assembly is operative to rotate the door assembly 180° after releasing it and before transporting it.

10. The assembly of claim 1, wherein the door interface mechanism is operative to lift the door assembly.

11. The assembly of claim 1 further comprising a substrate end effector assembly attached to the drive mechanism.

12. The assembly of claim 11, wherein the end effector assembly comprises multiple end effectors.

13. The assembly of claim 12, wherein the multiple end effectors are vertically aligned.

14. The assembly of claim 11, wherein the end effector assembly comprises two end effectors oriented at 180.

15. The assembly of claim 11, wherein the end effector assembly is rotatable about a vertical axis.

16. The substrate carrier door removal assembly of claim 2 wherein the storage position includes a frame to hold the door assembly.

17. The substrate carrier door removal assembly of claim 2 further including storing the door assembly in a frame affixed to a pedestal for the robot.

18. The substrate carrier door removal assembly of claim 2 wherein the door interface mechanism further includes an alignment rod.

19. A substrate processing system, comprising:
a substrate processing chamber having an opening in a wall therein for receiving a substrate carrier, a port door operative to removably seal the opening, and a receptacle for receiving a door assembly that has been removed from the opening, the door assembly comprising a substrate carrier door coupled to the port door,;
a robot positioned within the substrate processing chamber;
a drive mechanism connected to the robot; and
a door interface mechanism attached to the drive mechanism, the door interface mechanism including a door key control assembly, the drive mechanism providing mechanical control of the door key control assembly operative to manipulate the door key to release the door assembly, the receptacle mounted on the wall in a position selected from above the substrate carrier, beside the substrate carrier and below the substrate carrier.

20. The system of claim 19, wherein the receptacle is selected from the group of a ledge, a frame, and a bar.

21. The system of claim 19, wherein the door interface mechanism is operative to retain the released door assembly thereon.

22. The system of claim 19, wherein the receptacle further includes a door parking assembly.

23. The system of claim 22, wherein the door parking assembly comprises a lifting and lowering mechanism operative to lower the door assembly into a storage area and lift the door assembly from the storage area.

24. The system of claim 23, wherein the lifting and lowering mechanism includes:
a door lifter plate vertically movable in the storage area;
a press arm plate vertically movable in the storage area adjacent the door lifter plate; and
a lever arm pivotally connected to the door lifter plate and the press arm plate to provide lifting movement of the door lifter plate upon lowering movement of the press arm plate.

25. The system of claim 19, wherein the port door further comprises a coupling mechanism operative to latch the port door to the opening.

26. The system of claim 25, wherein:
the opening includes a bezel therein including a latch receiving housing; and
the port door includes a horizontally movable latching tab configured to fit within the latch receiving housing on the bezel, a vertically movable interface plate mounted to the port door to receive the door interface mechanism, and a vertical-to-horizontal mechanism operative to convert vertical motion of the interface plate to horizontal motion of the latching tab.

27. The system of claim 26, wherein the vertical-to-horizontal mechanism is further operative to manipulate the door key.

28. The system of claim 19, wherein the port door includes a vertically movable hook extending into the substrate processing chamber, the hook coupled to a mechanism to convert vertical motion of the hook to rotary motion to turn the door key.

29. The system of claim 19, wherein the substrate processing chamber further includes track members extending vertically below the opening, the door assembly configured to run along the track members to an area below the opening.

30. The system of claim 29, wherein the port door further includes horizontally extendible members configured to run along the track members.

31. The system of claim 30, wherein the door interface mechanism is operative to extend the horizontally extendible members.

32. The system of claim 19, further comprising an air bladder gasket provided around the circumference of the opening and an air bladder inflatable to seal the port door within the opening.

33. The system of claim 19, wherein the port door is pivotally mounted to the wall of the substrate processing chamber.

34. The system of claim 19, wherein the port door includes a ramped surface and the door interface mechanism includes a roller assembly operative to receive the ramped surface of the port door coupled to the substrate carrier door between a wall of the substrate processing chamber and the roller assembly.

35. The system of claim 19, wherein the drive mechanism includes a substrate end effector.

36. The system of claim 19, further comprising a robot transport mechanism attached to the robot to sequentially position the robot at a plurality of substrate carrier doors.

37. The system of claim 19, wherein the processing chamber is environmentally controlled.

38. The substrate processing system of claims 19 further comprising a receptacle mounted on a pedestal of the robot.

39. A method of processing a substrate, the method comprising the steps of:
removing a substrate carrier door and a port door coupled together as a door assembly from a substrate carrier accessible through a wall with a substrate carrier door removal assembly positioned on a robot;
operating the robot to store the door assembly on the wall adjacent to the substrate carrier; and
manipulating the robot to transport a substrate positioned within the substrate carrier to a substrate processing or load station.

40. The method of claim 39, further comprising the steps of:
positioning the robot at a second substrate carrier;
removing a second substrate carrier door and a second port door coupled together as a second door assembly from a second substrate carrier accessible through the wall with said substrate carrier door removal assembly;
operating the robot to store the second door assembly on the wall adjacent to the second substrate carrier; and
manipulating the robot to transport a second substrate positioned within the second substrate carrier to a substrate processing or load station.

41. The method of claim 39, wherein the removing step includes the step of removing the door assembly from the substrate carrier with a substrate carrier door removal assembly including a door interface mechanism connected to a drive mechanism, and wherein the operating step includes the step of releasing the door interface mechanism from the drive mechanism such that the door assembly is stored with the door interface mechanism.

42. The method of claim 39, wherein the removing step includes the step of removing the door assembly from the substrate carrier with a substrate carrier door removal assembly including a door interface mechanism connected to a drive mechanism, and wherein the operating step includes the step of releasing the door interface mechanism from the door assembly to store the door assembly.

43. The method of claim 39, wherein the operating step includes the step of operating the robot to store the door assembly in a frame or on a ledge.

44. The method of claim 39, wherein the operating step includes the step of carrying the door assembly on the substrate carrier door removal assembly during transport of a substrate.

* * * * *

UNITED STATES PATENT AND TRADEMARK OFFICE
CERTIFICATE OF CORRECTION

| | | |
|---|---|---|
| PATENT NO. | : 6,520,726 B1 | |
| DATED | : February 18, 2003 | |
| INVENTOR(S) | : Gregory Cook et al. | |

It is certified that error appears in the above-identified patent and that said Letters Patent is hereby corrected as shown below:

<u>Title page,</u>
Item [75], Inventors, "Lang Van Nugyen" should read -- Lang Van Nguyen --.

Signed and Sealed this

Twenty-eighth Day of October, 2003

JAMES E. ROGAN
*Director of the United States Patent and Trademark Office*